(12) United States Patent
Yamazaki

(10) Patent No.: US 9,601,591 B2
(45) Date of Patent: Mar. 21, 2017

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/448,041

(22) Filed: Jul. 31, 2014

(65) Prior Publication Data

US 2015/0041802 A1    Feb. 12, 2015

(30) Foreign Application Priority Data

Aug. 9, 2013   (JP) .................. 2013-165779
Aug. 9, 2013   (JP) .................. 2013-165851
Aug. 9, 2013   (JP) .................. 2013-165852

(51) Int. Cl.
   *H01L 29/78*   (2006.01)
   *H01L 29/49*   (2006.01)
   (Continued)

(52) U.S. Cl.
   CPC .... *H01L 29/4908* (2013.01); *H01L 29/66969* (2013.01); *H01L 29/7869* (2013.01); *H01L 29/78609* (2013.01)

(58) Field of Classification Search
   CPC .......... H01L 29/4908; H01L 29/66969; H01L 29/78609; H01L 29/7869
   (Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Yamazaki.S, "31a-F-3 A consideration of a cluster in an insulating film", Extended Abstracts of JSAP, The 18th spring meeting (1971), 1971, p. 124.

(Continued)

*Primary Examiner* — Whitney T Moore
*Assistant Examiner* — Joseph Galvin, III
(74) *Attorney, Agent, or Firm* — Robinson Intellectual Property Law Office; Eric J. Robinson

(57) ABSTRACT

To provide a transistor in which a channel is formed in an oxide semiconductor and which has stable electrical characteristics. To suppress shift in threshold voltage of a transistor in which a channel is formed in an oxide semiconductor. To provide a normally-off switching element having a positive threshold voltage as an n-channel transistor in which a channel is formed in an oxide semiconductor. A base insulating layer is formed over a substrate, an oxide semiconductor layer is formed over the base insulating layer, a first gate insulating layer is formed over the oxide semiconductor layer, a second gate insulating layer is formed over the first gate insulating layer by a sputtering method or an atomic layer deposition method at a substrate temperature of higher than or equal to 100° C., and a gate electrode layer is formed over the second gate insulating layer.

17 Claims, 24 Drawing Sheets

(51) Int. Cl.
*H01L 29/66* (2006.01)
*H01L 29/786* (2006.01)

(58) Field of Classification Search
USPC ........................................................ 438/104
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,385,105 | B2 | 2/2013 | Saito |
| 8,653,514 | B2 | 2/2014 | Yamazaki |
| 8,841,675 | B2 | 9/2014 | Saito et al. |
| 8,871,595 | B2 | 10/2014 | Ramkumar et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0034518 | A1 | 2/2003 | Yoshikawa |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0082966 | A1 | 4/2005 | Yamazaki et al. |
| 2005/0199959 | A1 | 9/2005 | Chiang et al. |
| 2005/0214996 | A1 | 9/2005 | Yoshino |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0211259 | A1 | 9/2006 | Maes et al. |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1* | 11/2006 | Sugihara ........... H01L 29/66969 257/646 |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0051954 | A1* | 3/2007 | Yan ................... H01L 27/1255 257/59 |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0142910 | A1* | 6/2008 | Oh ................... H01L 21/28202 257/411 |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0079169 | A1* | 4/2010 | Kim ................... H01L 27/1203 326/120 |
| 2010/0092800 | A1 | 4/2010 | Itagaki et al. |
| 2010/0109002 | A1 | 5/2010 | Itagaki et al. |
| 2011/0114946 | A1* | 5/2011 | Saito ................... G11C 7/005 257/43 |
| 2012/0049288 | A1* | 3/2012 | Maruyama ........ H01L 21/82385 257/369 |
| 2013/0203214 | A1 | 8/2013 | Isobe et al. |
| 2014/0239379 | A1 | 8/2014 | Matsuo et al. |
| 2015/0041801 | A1 | 2/2015 | Yamazaki et al. |
| 2015/0041802 | A1 | 2/2015 | Yamazaki |
| 2015/0155312 | A1 | 6/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005244066 A * | 9/2005 |
| WO | WO-2004/114391 | 12/2004 |

(56) References Cited

FOREIGN PATENT DOCUMENTS

OTHER PUBLICATIONS

Sugimura.Y et al., "31a-F-2 Synthesis of Silicon Nitride Film using Catalyst", Extended Abstracts of JSAP, The 18th spring meeting (1971), 1971, p. 123.
Nomura.K et al., "Thin-Film Transistor Fabricated in Single-Crystalline Transparent Oxide Semiconductor", Science, May 23, 2003, vol. 300, No. 5623, pp. 1269-1272.
Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE TRansactions on Electron Devices, Jul. 1, 1995, vol. 42, No. 7, pp. 1240-1246.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", PHYS. REV. A (Physical Review, A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZNO Thin-Film Transistors Produced at Room Temperature", APPL. PHYS. LETT. (Applied Physics LEtters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZNO TFTS) for AMLDCS", J. SOC. INF. Display (Journal of the Society for Information Display), 2007, vol. 15, No. 1, pp. 17-22.
Hosono.H et al., "Working hypothesis to explore novel wide band gap electrically conducting amorphous oxides and examples", J. NON-CRYST. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", PHYS. REV. B (Physical Review. B), Oct. 4, 2007, vol. 76, No. 16, pp. 165202-1-165202-22.
Janotti.A et al., "Oxygen Vacancies In ZnO", APPL. PHYS. LETT. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5) Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", ADV. MATER. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "SPINEL,YBFE2O4, and YB2FE3O7 Types of Structures for Compounds in the IN2O3 and SC2O3-A2O3-BO Systems [A; Fe, Ga, Or Al; B; Mg, Mn, Fe, Ni, Cu, Or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)m (m =7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", PHYS. REV. LETT. (Physical Review Letters), Jan. 26, 2007, vol. 98, pp. 045501-4-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-INCH) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. APPL. PHYS. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", PHYS. REV. LETT. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", JPN. J. APPL. PHYS. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", APPL. PHYS. LETT. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", PHYS. REV. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. SOC. (Journal of the Electrochemical Society), 2008, vol. 155, No. 12, pp. H1009-H1014.

Ohara.H et al., "21.3:4.0 in. QVGA AMOLED Display Using In-Ga-Zn-Oxide TFTS With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", PHYS. REV. B. (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", APPL. PHYS. LETT. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", APPL. PHYS. LETT. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZNO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", APPL. PHYS. LETT. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—1n2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered AI2O3 Gate Insulator", APPL. PHYS. LETT. (Applied Physics Letters), Sep. 1, 2003, vol. 83, No. 9, pp. 1755-1757.

Van de Walle.C, "Hydrogen as a Cause of Doping in Zinc Oxide", PHYS. REV. LETT. (Physical Review Letters), Jul. 31, 2000, vol. 85, No. 5, pp. 1012-1015.

* cited by examiner

FIG. 1A1
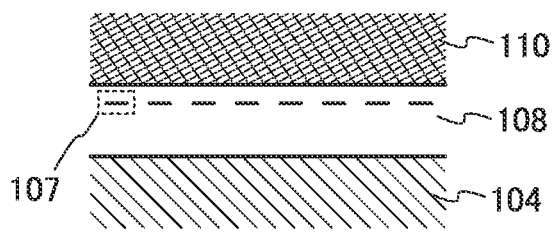
FIG. 1A2
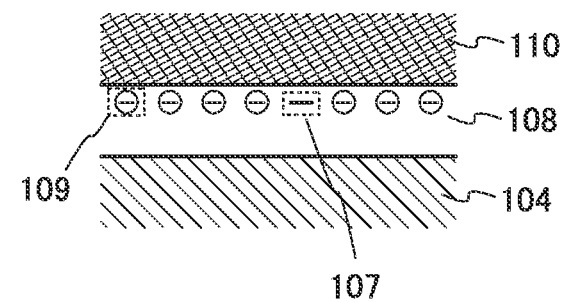
FIG. 1B
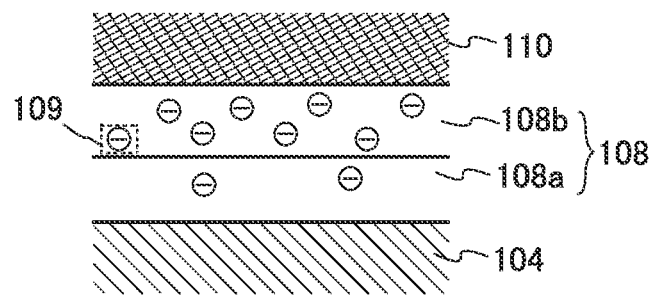
FIG. 1C
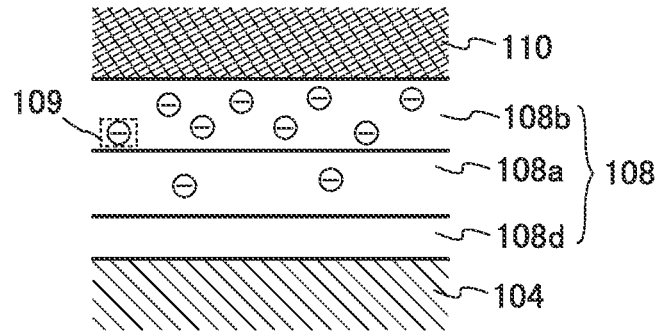

FIG. 2A1
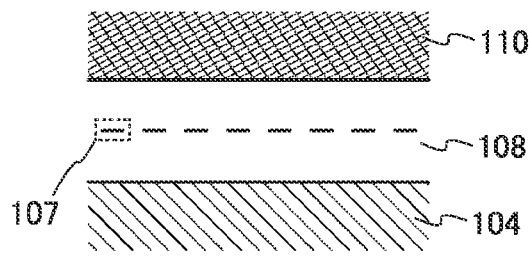
FIG. 2A2
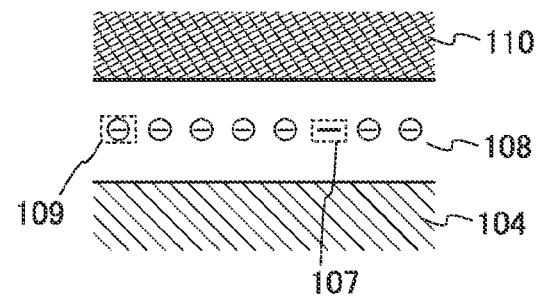
FIG. 2B
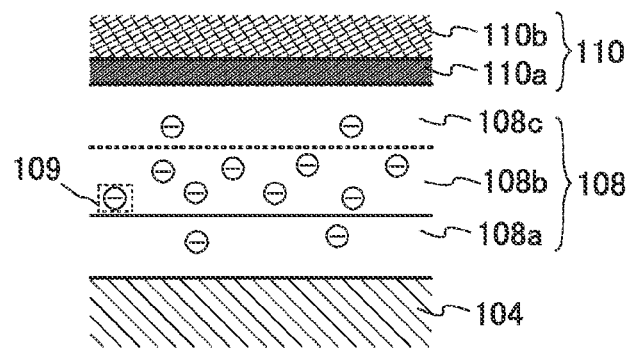
FIG. 2C
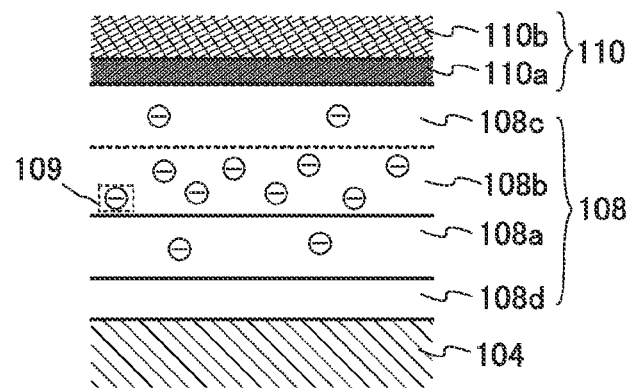

FIG. 17A1
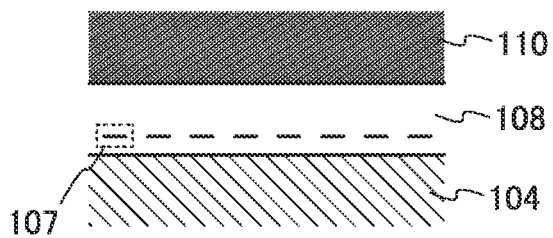
FIG. 17A2
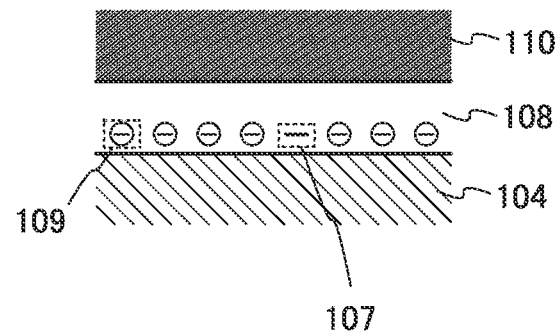
FIG. 17B
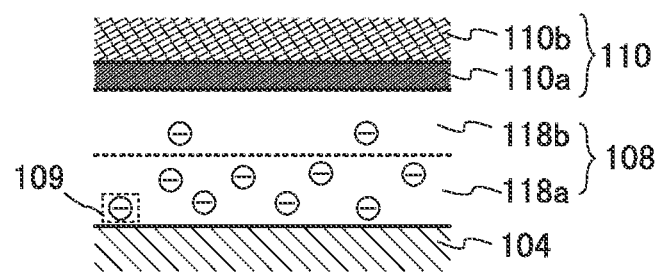

FIG. 18A1
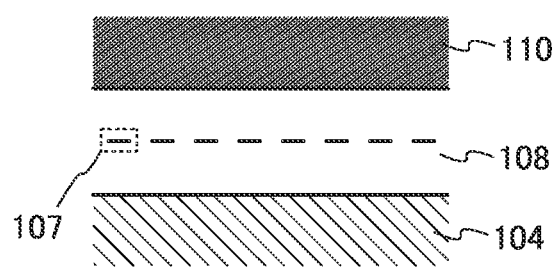
FIG. 18A2
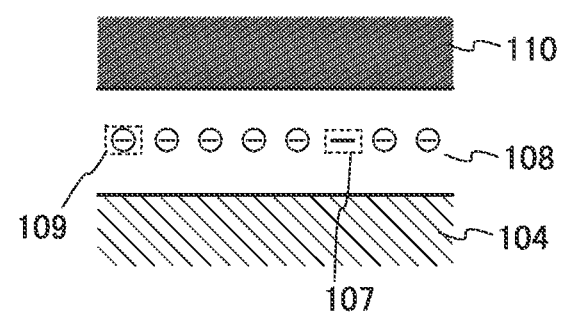
FIG. 18B
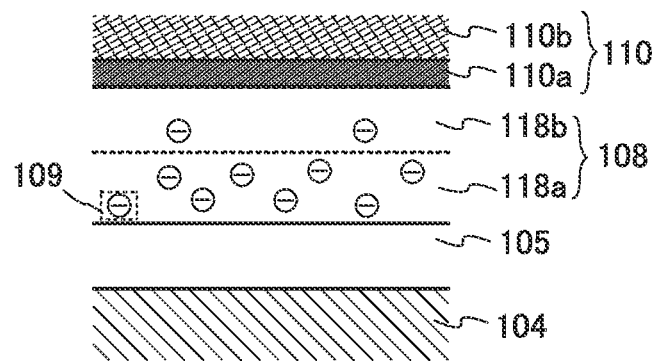

METHOD FOR MANUFACTURING SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a driving method thereof, or a manufacturing method thereof. In particular, one embodiment of the present invention relates to a semiconductor device, a display device, or a light-emitting device each including an oxide semiconductor.

In this specification and the like, a "semiconductor device" generally refers to a device which can function by utilizing semiconductor characteristics: an electro-optical device, a semiconductor circuit, and an electronic device are all included in the category of the semiconductor device.

2. Description of the Related Art

A technique in which a transistor is formed using a semiconductor layer has attracted attention. The transistor is used in a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, it is confirmed that an oxide semiconductor including an In—Ga—Zn oxide is applicable to a channel formation region of a thin film transistor (Non-Patent Document 1). Non-Patent Document 1 discloses a top-gate transistor including a hafnium oxide layer which is over and in contact with an oxide semiconductor layer including an In—Ga—Zn oxide and which is used as a gate insulating layer and an indium tin oxide layer which is over and in contact with the hafnium oxide layer and which is used as a gate electrode layer.

As a method for controlling the threshold voltage of a transistor using a silicon semiconductor, a method in which impurity elements are added to a region in which a channel is formed (channel doping) is known.

Meanwhile, it is known that in the case where oxygen vacancies exist in an oxide semiconductor of a transistor using an oxide semiconductor, part of the oxygen vacancies becomes donors and causes release of electrons serving as carriers. When the electrons serving as carriers are released, a channel is formed in the transistor without application of voltage to a gate, whereby the threshold voltage is shifted in the negative direction. Since it is difficult to completely eliminate oxygen vacancies included in the oxide semiconductor, the threshold voltage of the transistor using the oxide semiconductor is hardly controlled; thus, the transistor tends to be normally on.

A method for suppressing shift in threshold voltage of a transistor using an oxide semiconductor in the negative direction has been studied; however, it is hard to say that a method for causing shift in the threshold voltage in the positive direction has been established.

It is known that in an MIS structure including a silicon semiconductor, negative charges are trapped in trap centers in an insulating layer formed over a semiconductor layer, and thus flat band voltage is shifted (changed) in the positive direction, and a cluster of metal is reported as a trap center (see Non-Patent Document 2).

REFERENCE

Non-Patent Document

[Non-Patent Document 1] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272

[Non-Patent Document 2] S. Yamazaki, "A consideration of a cluster in an insulating film", preliminary drafts for the $18^{th}$ spring meeting of the Japan Society of Applied Physics and Related Societies, 1971, Japan, Vol. 2, p. 124

SUMMARY OF THE INVENTION

In the case where an oxide semiconductor is used for a channel formation region in a transistor, when an insulating layer provided in contact with the oxide semiconductor includes a cluster of metal serving as a trap center, a charge is trapped in the trap center, and thus the threshold voltage can be shifted in the positive direction. However, since the charge trapped in the cluster of metal easily recombines, the electron cannot be a stable fixed charge.

In view of the above, an object of one embodiment of the present invention is to provide a transistor in which a channel is formed in an oxide semiconductor and which has stable electrical characteristics. Another object of one embodiment of the present invention is to suppress shift in the threshold voltage of a transistor in which a channel is formed in an oxide semiconductor. Another object of one embodiment of the present invention is to provide a normally-off switching n-channel transistor which has a positive threshold voltage and in which a channel is formed in an oxide semiconductor.

Note that the description of these objects does not disturb the existence of other objects. One embodiment of the present invention does not necessarily achieve all the objects. Objects other than the above objects will be apparent from and can be derived from the description of the specification and the like.

One embodiment of the present invention is a method for manufacturing a semiconductor device, including the steps of forming a base insulating layer over a substrate, forming an oxide semiconductor layer over the base insulating layer, forming a first gate insulating layer over the oxide semiconductor layer, forming a second gate insulating layer over the first gate insulating layer by a sputtering method or an atomic layer deposition method at a substrate temperature of higher than or equal to 100° C., and forming a gate electrode layer over the second gate insulating layer.

The second gate insulating layer is preferably formed to include trap centers in a specific region.

Heat treatment is preferably performed at a temperature of lower than 500° C. after the second gate insulating layer is formed.

Another embodiment of the present invention is a semiconductor device including an oxide semiconductor layer, a gate insulating layer which is in contact with the oxide semiconductor layer and has negative fixed charges, and a gate electrode layer which overlaps with the oxide semiconductor layer with the gate insulating layer therebetween and includes at least a metal nitride film having conductivity. The metal nitride film of the gate electrode layer is in contact with the gate insulating layer.

Another embodiment of the present invention is a semiconductor device including an oxide semiconductor layer, a gate insulating layer which is in contact with the oxide semiconductor layer and has negative fixed charges, and a gate electrode layer which overlaps with the oxide semiconductor layer with the gate insulating layer therebetween and includes at least a metal nitride film having conductivity. The metal nitride film of the gate electrode layer is in contact with the gate insulating layer. The gate insulating layer includes a region containing nitrogen in the vicinity of the interface with the gate electrode layer.

In the above semiconductor device, the nitrogen concentration in a region of the gate insulating layer which is in contact with the gate electrode layer is higher than the nitrogen concentration in a region of the gate insulating layer which is in contact with the oxide semiconductor layer.

In the above semiconductor device, electrons are trapped in charge trap states included in the gate insulating layer.

In the above semiconductor device, the gate insulating layer preferably contains hafnium oxide.

In the above semiconductor device, the negative fixed charges included in the gate insulating layer are apart from the oxide semiconductor layer.

Another embodiment of the present invention is a semiconductor device including an oxide semiconductor layer, a gate insulating layer which is in contact with the oxide semiconductor layer, which includes hafnium oxide, and which is negatively charged, and a gate electrode layer which overlaps with the oxide semiconductor layer with the gate insulating layer therebetween and which includes at least a nitride metal film. The nitride metal film of the gate electrode layer is in contact with the gate insulating layer.

Another embodiment of the present invention is a semiconductor device including an oxide semiconductor layer, a gate insulating layer which is in contact with the oxide semiconductor layer, which includes hafnium oxide, and which is negatively charged, and a gate electrode layer which overlaps with the oxide semiconductor layer with the gate insulating layer therebetween and which includes at least a nitride metal film. The nitride metal film of the gate electrode layer is in contact with the gate insulating layer. The threshold voltage is higher than or equal to 0 V.

In the above semiconductor device, an insulating layer including silicon oxide or silicon oxynitride may be included between the gate insulating layer and the oxide semiconductor layer.

Another embodiment of the present invention is a semiconductor device including an oxide semiconductor layer, a gate electrode layer overlapping with the oxide semiconductor layer, and a gate insulating layer between the oxide semiconductor layer and the gate electrode layer. The gate insulating layer includes a first gate insulating layer and a second gate insulating layer including negative fixed charges. The first gate insulating layer is between the second gate insulating layer and the oxide semiconductor layer and has density of negative fixed charges lower than that of the second gate insulating layer.

Another embodiment of the present invention is a semiconductor device including an oxide semiconductor layer, a gate electrode layer overlapping with the oxide semiconductor layer, and a gate insulating layer between the oxide semiconductor layer and the gate electrode layer. The gate insulating layer includes a first gate insulating layer and a second gate insulating layer including negative fixed charges. The first gate insulating layer is between the second gate insulating layer and the oxide semiconductor layer and has density of negative fixed charges lower than that of the second gate insulating layer. The negative fixed charges included in the second gate insulating layer are apart from the gate electrode layer.

In the above semiconductor device, electrons are trapped in charge trap states included in the second gate insulating layer.

In the above semiconductor device, the second gate insulating layer is preferably formed using hafnium oxide.

In the above semiconductor device, the first gate insulating layer is preferably formed using hafnium oxide and at least one selected from nitrogen, zirconium, and lanthanoid.

Another embodiment of the present invention is a semiconductor device including an oxide semiconductor layer, a gate electrode layer overlapping with the oxide semiconductor layer, and a gate insulating layer between the oxide semiconductor layer and the gate electrode layer. The gate insulating layer includes a first gate insulating layer which is formed using hafnium oxide and at least one selected from nitrogen, zirconium, and lanthanoid and a second gate insulating layer which is formed using hafnium oxide and is negatively charged. The first gate insulating layer is between the second gate insulating layer and the oxide semiconductor layer.

Another embodiment of the present invention is a semiconductor device including an oxide semiconductor layer, a gate electrode layer overlapping with the oxide semiconductor layer, and a gate insulating layer between the oxide semiconductor layer and the gate electrode layer. The gate insulating layer includes a first gate insulating layer which is formed using hafnium oxide and at least one selected from nitrogen, zirconium, and lanthanoid and a second gate insulating layer which is formed using hafnium oxide and is negatively charged. The first gate insulating layer is between the second gate insulating layer and the oxide semiconductor layer. The threshold voltage is higher than or equal to 0 V.

In the above semiconductor device, an insulating layer including nitrogen and hafnium oxide is preferably included between the gate electrode layer and the second gate insulating layer.

In the above semiconductor device, an insulating layer including silicon oxide or silicon oxynitride may be included between the first gate insulating layer and the oxide semiconductor layer.

One embodiment of the present invention can provide a transistor in which a channel is formed in an oxide semiconductor and which has stable electrical characteristics. Another embodiment of the present invention can suppress shift in the threshold voltage of a transistor in which a channel is formed in an oxide semiconductor. Another embodiment of the present invention can provide a normally-off switching n-channel transistor which has a positive threshold voltage in which a channel is formed in an oxide semiconductor.

BRIEF DESCRIPTION OF THE DRAWINGS

In the accompanying drawings:

FIGS. 1A1, 1A2, 1B, and 1C are each a conceptual diagram of a stacked-layer structure included in a semiconductor device of one embodiment of the present invention;

FIGS. 2A1, 2A2, 2B, and 2C are each a conceptual diagram of a stacked-layer structure included in a semiconductor device of one embodiment of the present invention;

FIGS. 17A1, 17A2, and 17B are each a conceptual diagram of a stacked-layer structure included in a semiconductor device of one embodiment of the present invention;

FIGS. 18A1, 18A2, and 18B are each a conceptual diagram of a stacked-layer structure included in a semiconductor device of one embodiment of the present invention;

DETAILED DESCRIPTION OF THE INVENTION

Figure 3A:
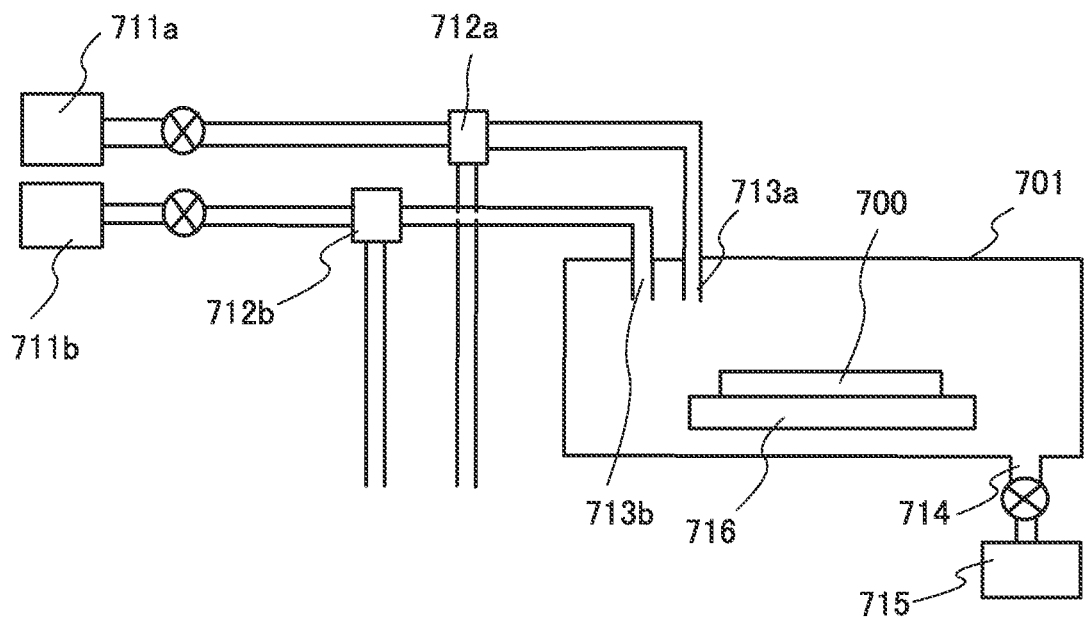
FIG. 3A is a schematic cross-sectional view of a deposition apparatus and FIG. 3B is a schematic top view of a manufacturing apparatus including one chamber corresponding to the deposition apparatus.

Hereinafter, embodiments of the present invention will be described in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such scales.

In this specification, ordinal numbers such as "first", "second", and the like are used in order to avoid confusion among components, and the terms do not limit the components numerically. Therefore, for example, description can be made even when "first" is replaced with "second" or "third", as appropriate.

Embodiment 1

In this embodiment, a stacked-layer structure included in a semiconductor device of one embodiment of the present invention will be described with reference to FIGS. 1A1, 1A2, 1B, and 1C and FIGS. 2A1, 2A2, 2B, and 2C.

A technical idea of one embodiment of the present invention is that in a transistor in which a channel is formed in an oxide semiconductor, a gate insulating layer overlapping with an oxide semiconductor layer includes a predetermined number of negative fixed charges and/or charge trap states (trap centers) trapping negative charges. As the gate insulating layer of the transistor, an insulating layer including a predetermined number of negative fixed charges is used; thus, even when voltage is not applied to a gate electrode layer, a negative electric field is always applied to a channel formation region. In other words, voltage applied to the gate electrode layer is necessarily increased to form the channel; accordingly, the threshold voltage of the transistor can be shifted (changed) in the positive direction. Furthermore, the transistor of one embodiment of the present invention has a structure in which the negative fixed charges and/or the charge trap states trapping the negative charges included in the gate insulating layer exist to be apart from the oxide semiconductor layer. Thus, the negative charges trapped in the charge trap states can be prevented from being released (injected) to the oxide semiconductor layer.

<Stacked-Layer Structure 1 Included in Semiconductor Device>

FIGS. 1A1 and 1A2 are conceptual diagrams of the stacked-layer structure included in the semiconductor device of one embodiment of the present invention.

FIG. 1A1 illustrates a semiconductor device including an oxide semiconductor layer 104, a gate insulating layer 108 provided over the oxide semiconductor layer 104 and including charge trap states 107, and a gate electrode layer 110 overlapping with the oxide semiconductor layer 104 with the gate insulating layer 108 provided therebetween. The charge trap states 107 included in the gate insulating layer 108 exist to be apart from the oxide semiconductor layer 104. After the stacked-layer structure illustrated in FIG. 1A1 is formed, the potential of the gate electrode layer 110 is kept higher than the potentials of a source and a drain (not illustrated) for one second or more, typically, one minute or more at a temperature higher than the operating temperature or the storage temperature of the semiconductor device, or higher than or equal to 125° C. and lower than or equal to 450° C., typically, higher than or equal to 150° C.

and lower than or equal to 300° C.; thus, charges are trapped in the charge trap states 107 included in the gate insulating layer 108.

FIG. 1A2 is a conceptual diagram illustrating the structure of the semiconductor device illustrated in FIG. 1A1 after treatment in which charges are trapped in the charge trap states 107 (hereinafter also referred to as charge trapping treatment) is performed on the semiconductor device, and the semiconductor device includes negative charges 109 in which electrons are trapped in some or all of the charge trap states 107 included in the gate insulating layer 108. The number of the negative charges 109 included in the gate insulating layer 108 can be controlled by the potential of the gate electrode layer 110 in the charge trapping treatment. The total number of electrons trapped in the charge trap states 107 (i.e., the total number of the negative charges 109 in FIG. 1A2) is increased linearly at the beginning of the charge trapping treatment, and the rate of increase gradually decreases and then converges on a certain value. The convergence value depends on the potential of the gate electrode layer 110. As the potential is higher, the number of trapped electrons is more likely to be large; however, it never exceeds the total number of the charge trap states 107.

When the gate insulating layer 108 includes negative charges, the threshold voltage of the semiconductor device is shifted in the positive direction. Furthermore, when the negative charges included in the gate insulating layer 108 are fixed charges, further shift of the threshold voltage is suppressed, and the semiconductor device can have stable electrical characteristics. For these reasons, in the semiconductor device in FIG. 1A2, the negative charges 109 trapped in the charge trap states are required to become stable negative fixed charges in the gate insulating layer 108 and not to be released from the gate insulating layer 108.

In the structure illustrated in FIG. 1A2, the negative charges 109 included in the gate insulating layer 108 exist to be apart from an interface of the oxide semiconductor layer 104; thus, release of the negative charges 109 to the oxide semiconductor layer 104 can be suppressed. Therefore, the gate insulating layer 108 which includes stable negative fixed charges and in which release of charges is suppressed can be formed. By providing such a gate insulating layer 108 including the stable negative charges 109, it is possible to provide a semiconductor device having stable electrical characteristics in which a shift of the threshold voltage after the charge trapping treatment, i.e., after a predetermined number of charges are held by the gate insulating layer 108, is suppressed.

In addition, it is also effective for fixing negative charges that the effective mass of a hole is extremely large in an oxide semiconductor. This is because the injection of holes from the oxide semiconductor layer 104 to the gate insulating layer 108 does not occur and consequently a phenomenon in which the negative charges 109 combine with holes and disappear substantially cannot occur; thus, the negative charges 109 included in the gate insulating layer 108 can be stabilized.

Note that the amount of shift in the threshold voltage can be controlled by the total number of the negative charges 109 included in the gate insulating layer 108. It is preferable that in an n-channel transistor including the oxide semiconductor layer 104, the gate insulating layer 108 include the negative charges 109 to such a degree that it has positive threshold voltage and be controlled to be normally off.

<Structure Example 1 of Gate Insulating Layer>

FIG. 1B illustrates a specific structure example of the semiconductor device having the structure illustrated in FIG. 1A2. The semiconductor device illustrated in FIG. 1B includes the oxide semiconductor layer 104, the gate insulating layer 108 which includes a gate insulating layer 108a and a gate insulating layer 108b and is over the oxide semiconductor layer 104, and the gate electrode layer 110 over the gate insulating layer 108. In the stacked-layer structure of the gate insulating layer 108, the gate insulating layer 108b is an insulating layer including the negative charges 109. In other words, the gate insulating layer 108b is a negatively charged insulating layer. The gate insulating layer 108a is an insulating layer between the oxide semiconductor layer 104 and the gate insulating layer 108b so that the oxide semiconductor layer 104 and the negative charges 109 included in the gate insulating layer 108b are apart from each other.

For the gate insulating layer 108b, a material and/or a formation method are/is selected so that the gate insulating layer 108b includes charge trap states. For example, as the gate insulating layer 108b, an insulating layer formed using an oxide (including a composite oxide) containing one or more elements selected from hafnium, aluminum, tantalum, zirconium, and the like can be used. It is preferable to use an insulating layer formed using hafnium oxide, an insulating layer formed using aluminum oxide, an insulating layer formed using hafnium silicate, or an insulating layer formed using aluminum silicate. A high dielectric constant (high-k) material such as hafnium oxide is preferably used for a gate insulating layer because the thickness of the gate insulating layer can be increased to prevent gate leakage and at the same time electrical characteristics can be maintained. In this embodiment, an insulating layer formed using hafnium oxide is formed as the gate insulating layer 108b. It is possible to employ a sputtering method or an atomic layer deposition (ALD) method as a method for forming the gate insulating layer 108b.

In the gate insulating layer 108 having the stacked-layer structure, the gate insulating layer 108a on the oxide semiconductor layer 104 side has lower density of the negative charges 109 than the gate insulating layer 108b. In other words, the density of charge trap states which might be included in the gate insulating layer 108a before the charge trapping treatment is lower than that of charge trap states included in the gate insulating layer 108b.

Although negative fixed charges might be included in the gate insulating layer 108a depending on the material and/or formation method of the gate insulating layer 108a, the total number thereof is extremely small compared with the gate insulating layer 108b. Consequently, it can be said that the negative charges 109 included in the gate insulating layer 108 be relatively apart from the oxide semiconductor layer 104.

In this embodiment, an insulating layer formed using hafnium oxide and at least one selected from nitrogen, zirconium, and lanthanoid is used as the gate insulating layer 108a. As lanthanoid, lanthanum, cerium, neodymium, or gadolinium can be used, for example. Nitrogen, zirconium, and lanthanoid have a function of making charge trap states included in an insulating layer formed using an oxide (including a composite oxide) containing one or more elements selected from hafnium, aluminum, tantalum, and the like disappear. Alternatively, by including nitrogen, zirconium, or lanthanoid, defects in an insulating layer formed using an oxide (including a composite oxide) containing one or more elements selected from hafnium, aluminum, tantalum, and the like can be decreased. Consequently, the gate insulating layer 108a formed using hafnium oxide and at least one selected from nitrogen, zirconium, and lanthanoid can have lower density of charge trap states compared with the gate insulating layer 108b formed using hafnium oxide.

As a method for forming the gate insulating layer 108a, a sputtering method or an ALD method can be employed. Nitrogen, zirconium, or lanthanoid can be introduced into the gate insulating layer 108a in such a manner that a gas containing nitrogen, zirconium, or lanthanoid is supplied to a deposition chamber when a hafnium oxide film is formed. Alternatively, nitrogen, zirconium, or lanthanoid may be added by an ion implantation method, an ion doping method, or the like after the hafnium oxide film is formed. The doping concentration can be appropriately set based on the total number of the negative charges 109 which is required in the gate insulating layer 108.

The film formation temperature of the gate insulating layer 108a is preferably 100° C. or higher, more preferably 150° C. or higher. By forming the gate insulating layer 108a in the above temperature range, attachment of hydrogen or a hydrogen compound (e.g., adsorbed water) to the oxide semiconductor layer 104 which is below the gate insulating layer 108a can be prevented, and entry of hydrogen or a hydrogen compound into the oxide semiconductor layer 104 can be decreased. Hydrogen partly serves as donors by bonding to an oxide semiconductor and causes generation of electrons serving as carriers, whereby the threshold voltage of the transistor is shifted in the negative direction. Therefore, the gate insulating layer 108a is formed while entry of hydrogen or a hydrogen compound into the oxide semiconductor layer 104 is decreased; thus, electrical characteristics of the transistor can be further stabilized. The same can be applied to the film formation temperature of the gate insulating layer 108b formed over the gate insulating layer 108a.

<Structure Example 2 of Gate Insulating Layer>

FIG. 1C illustrates another structure example of the semiconductor device having the structure illustrated in FIG. 1A2. The semiconductor device illustrated in FIG. 1C includes the gate insulating layer 108 having a stacked-layer structure of a gate insulating layer 108d, the gate insulating layer 108a, and the gate insulating layer 108b in this order from the side in contact with the oxide semiconductor layer 104, and is different from the semiconductor device illustrated in FIG. 1B in that the gate insulating layer 108d is included between the gate insulating layer 108a and the oxide semiconductor layer 104. The other components are the same as those of the semiconductor device in FIG. 1B; thus, detailed description is omitted.

In the semiconductor device illustrated in FIG. 1C, the gate insulating layer 108d in contact with the oxide semiconductor layer 104 preferably contains constituent elements different from those of the gate insulating layer 108a and the gate insulating layer 108b. For example, an insulating layer containing silicon oxide or silicon oxynitride can be used as the gate insulating layer 108d. In an insulating layer containing silicon oxide or silicon oxynitride, charge trap states are less likely to be formed than in the above insulating layer formed using an oxide (including a composite oxide) containing one or more elements selected from hafnium, aluminum, tantalum, and the like. Thus, by providing the gate insulating layer 108d between the oxide semiconductor layer 104 and the gate insulating layer 108a, the negative charges 109 included in the gate insulating layer 108 can be more surely apart from the oxide semiconductor layer 104. In other words, the negative charges 109 included in the gate insulating layer 108 can be further stabilized.

Note that the gate insulating layer 108d is preferably formed by a chemical vapor deposition (CVD) method. A film with a preferable film quality can be easily formed by a CVD method as compared with a sputtering method, and charge trap states are less likely to be formed in an insulating layer formed by a CVD method. Accordingly, by forming the gate insulating layer 108d by a CVD method, the amount of leakage current between a gate and a drain or between a gate and a source can be reduced in the transistor.

<Stacked-Layer Structure 2 Included in Semiconductor Device>

FIGS. 2A1 and 2A2 are other structure examples of the conceptual diagrams of the stacked-layer structure included in the semiconductor device of one embodiment of the present invention.

The semiconductor device illustrated in FIG. 2A1 is different from that in FIG. 1A1 in that the charge trap states 107 in the gate insulating layer 108 are apart from both the oxide semiconductor layer 104 and the gate electrode layer 110, and the other components are the same as those in FIG. 1A1. FIG. 2A2 is a conceptual diagram illustrating the structure of the semiconductor device illustrated in FIG. 2A1 after charge trapping treatment and is the same as that in FIG. 1A2 except that the negative charges 109 are apart from both the oxide semiconductor layer 104 and the gate electrode layer 110.

As described above, the following is required: the negative charges 109 trapped in the charge trap states are stably fixed in the gate insulating layer 108 and are not released from the gate insulating layer 108. Since the negative charges 109 included in the gate insulating layer 108 are apart from both interfaces of the oxide semiconductor layer 104 and the gate electrode layer 110 in the structure illustrated in FIG. 2A2, release of the negative charges 109 to the oxide semiconductor layer 104 and the gate electrode layer 110 is suppressed. Consequently, the threshold voltage of the semiconductor device can be fixed more stably.

<Structure Example 3 of Gate Insulating Layer>

FIG. 2B illustrates a structure example of the semiconductor device having the structure illustrated in FIG. 2A2. The semiconductor device illustrated in FIG. 2B includes the oxide semiconductor layer 104, the gate insulating layer 108 which includes the gate insulating layer 108a, the gate insulating layer 108b, and a gate insulating layer 108c and is over the oxide semiconductor layer 104, and the gate electrode layer 110 including a gate electrode layer 110a and a gate electrode layer 110b over the gate insulating layer 108. In the stacked-layer structure of the gate insulating layer 108, the gate insulating layer 108a and the gate insulating layer 108b can have the same structures as those in the semiconductor device in FIG. 1B. In other words, the gate insulating layer 108b includes the negative charges 109 and is a negatively charged insulating layer. The gate insulating layer 108a has lower density of negative fixed charges than the gate insulating layer 108b.

In the semiconductor device illustrated in FIG. 2B, the gate insulating layer 108c has a function of making the gate insulating layer 108b including the negative charges 109 and the gate electrode layer 110 apart from each other and has lower density of negative fixed charges than the gate insulating layer 108b. The gate insulating layer 108c can be formed using a formation method and a material which are similar to those of the above gate insulating layer 108a. Alternatively, by adding nitrogen, zirconium, or lanthanoid to the vicinity of a surface of an insulating layer including charge trap states formed over the gate insulating layer 108a, a first region where part of charge trap states disappears is formed in the vicinity of the surface, and the first region may serve as the gate insulating layer 108c. Note that in that case, a second region which is below the first region and to which nitrogen, zirconium, or lanthanoid is not added can serve as the gate insulating layer 108b including the charge trap states. In the case where part of the charge trap states included in the insulating layer are made to disappear to form the gate insulating layer 108c, the thicknesses of the gate insulating layer 108b and the gate insulating layer 108c can be controlled using the depth of a region to which nitrogen, zirconium, or lanthanoid is added.

Nitrogen, zirconium, or lanthanoid can be added to the vicinity of the surface of the insulating layer including the charge trap states by an ion implantation method or an ion doping method. Alternatively, in the case where a metal nitride film having conductivity is formed by a sputtering method as the gate electrode layer in contact with the gate insulating layer 108, sputtering is performed at the same time on the vicinity of the surface of the insulating layer including the charge trap states which is a surface over which the metal nitride film is formed; thus, nitrogen may be added to the region. Alternatively, after the metal nitride film having conductivity is formed, nitrogen is diffused to part of the insulating layer including the charge trap states by heat treatment; thus, the gate insulating layer 108c may be formed.

In this embodiment, the gate electrode layer 110 has a stacked-layer structure of the gate electrode layer 110a and the gate electrode layer 110b, and a metal nitride film having conductivity is used as the gate electrode layer 110a. Furthermore, in a step of forming the gate electrode layer 110a over the insulating layer including the charge trap states, nitrogen is added to the vicinity of the surface of the insulating layer at the same time, so that the gate insulating layer 108b and the gate insulating layer 108c are formed. Thus, a step of forming the gate insulating layer 108c can be simplified, which leads to reduction in manufacturing costs of the semiconductor device.

For formation of the insulating layer including the charge trap states, the above method for forming the gate insulating layer 108b can be referred to. As the metal nitride film having conductivity, a tantalum nitride film or a titanium nitride film can be used, for example. Note that the gate electrode layer 110 may be a single layer of a metal nitride film having conductivity.

Note that in the case where nitrogen, zirconium, or lanthanoid is added to part of the insulating layer including the charge trap states to form the gate insulating layer 108b and the gate insulating layer 108c, interfaces therebetween might not be clear. In FIG. 2B, the interface between the gate insulating layer 108b and the gate insulating layer 108c is schematically denoted by a dotted line. Furthermore, the concentration of nitrogen, zirconium, lanthanoid, or the like included in the gate insulating layer 108c might be gradient in the thickness direction.

In the semiconductor device illustrated in FIG. 2B, the negative charges 109 included in the gate insulating layer 108 are apart from an interface of the oxide semiconductor layer 104 with the use of the gate insulating layer 108a, and is apart from the gate electrode layer 110 with the use of the gate insulating layer 108c. Thus, release of the negative charges 109 to the oxide semiconductor layer 104 and the gate electrode layer 110 can be suppressed. Accordingly, the gate insulating layer 108 in which release of charges is suppressed and which includes more stable negative fixed charges can be formed.

<Structure Example 4 of Gate Insulating Layer>

FIG. 2C illustrates another structure example of the semiconductor device having the structure illustrated in FIG. 2A2. The semiconductor device illustrated in FIG. 2C includes the gate insulating layer 108 having a stacked-layer structure of the gate insulating layer 108d, the gate insulating layer 108a, the gate insulating layer 108b, and the gate insulating layer 108c in this order from the side in contact with the oxide semiconductor layer 104, and is different from the semiconductor device illustrated in FIG. 2B in that the gate insulating layer 108d is included between the gate insulating layer 108a and the oxide semiconductor layer 104. The other components are the same as those of the semiconductor device in FIG. 2B; thus, detailed description is omitted.

In the semiconductor device illustrated in FIG. 2C, the gate insulating layer 108d in contact with the oxide semiconductor layer 104 can have a structure similar to that of the gate insulating layer 108d illustrated in FIG. 1C. By providing the gate insulating layer 108d between the oxide semiconductor layer 104 and the gate insulating layer 108a, the negative charges 109 included in the gate insulating layer 108 can be more surely apart from the oxide semiconductor layer 104.

As described above, the semiconductor device in this embodiment includes a predetermined number of negative fixed charges in the gate insulating layer 108, and the negative fixed charges are apart from at least the oxide semiconductor layer 104; thus, the threshold voltage can be shifted in the positive direction and the shift after that can be suppressed. In other words, the structure described in this embodiment enables formation of a semiconductor device having a threshold voltage which is fixed to a positive value.

Note that charge trapping treatment may be performed during a process of manufacturing the semiconductor device, or in a period after manufacture of the semiconductor device and before shipment. For example, the treatment may be performed at any step before factory shipment, such as after formation of a wire metal connected to the source electrode or the drain electrode of the semiconductor device, after pretreatment (wafer processing), after a wafer-dicing step, or after packaging. In any case, it is preferable that the semiconductor device be not exposed to environment at temperatures higher than or equal to 125° C. for one hour or more after the step.

The structures, methods, and the like described in this embodiment can be combined as appropriate with any of the structures, methods, and the like described in the other embodiments.

Embodiment 2

A deposition apparatus which can be used for forming a semiconductor layer, an insulating layer, a conductive layer, and the like to be described in any of the other embodiments is described below.

In a conventional deposition apparatus utilizing a CVD method, one or a plurality of source material gases for reaction are supplied to a chamber at the same time at the time of deposition. In a deposition apparatus utilizing an ALD method, source material gases for reaction are sequentially introduced into a chamber, and then the sequence of the gas introduction is repeated. For example, two or more kinds of source material gases are sequentially supplied to the chamber by switching respective switching valves (also referred to as high-speed valves). For example, a first source material gas is introduced, an inert gas (e.g. argon or nitrogen) or the like is introduced after the introduction of the first source material gas so that the source material gases are not mixed, and then a second source material gas is introduced. Alternatively, the first source material gas may be exhausted by vacuum evacuation instead of the introduction of the inert gas, and then the second source material gas may be introduced. The first source material gas is adsorbed on a surface of the substrate to form a first single-atomic layer; then the second source material gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor Furthermore, plasma damage is not caused when an ALD method is employed.

FIG. 3A illustrates an example of a deposition apparatus utilizing an ALD method. The deposition apparatus utilizing an ALD method includes a deposition chamber (chamber 701), source material supply portions 711a and 711b, high-speed valves 712a and 712b which are flow rate controllers, source material introduction ports 713a and 713b, a source material exhaust port 714, and an evacuation unit 715. The source material introduction ports 713a and 713b provided in the chamber 701 are connected to the source material supply portions 711a and 711b, respectively, through supply tubes and valves. The source material exhaust port 714 is connected to the evacuation unit 715 through an exhaust tube, a valve, and a pressure controller.

A substrate holder 716 with a heater is provided in the chamber, and a substrate 700 over which a film is formed is provided over the substrate holder.

In the source material supply portions 711a and 711b, a source material gas is formed from a solid source material or a liquid source material by using a vaporizer, a heating unit, or the like. Alternatively, the source material supply portions 7111a and 711b may supply a gas source material.

Although two source material supply portions 711a and 711b are provided as an example, without limitation thereto, three or more source material supply portions may be provided. The high-speed valves 712a and 712b can be accurately controlled by time, and a source material gas and an inert gas are supplied by the high-speed valves 712a and 712b. The high-speed valves 712a and 712b are flow rate controllers for a source material gas, and can also be referred to as flow rate controllers for an inert gas.

In the deposition apparatus illustrated in FIG. 3A, a thin film is formed over a surface of the substrate 700 in the following manner: the substrate 700 is transferred to put on the substrate holder 716, the chamber 701 is sealed, the substrate 700 is heated to a desired temperature (e.g., higher than or equal to 100° C. or higher than or equal to 150° C.) with a heater of the substrate holder 716 with a heater; and supply of a source material gas, evacuation with the evacuation unit 715, supply of an inert gas, and evacuation with the evacuation unit 715 are repeated.

In the deposition apparatus illustrated in FIG. 3A, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 711a and 711b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 711a and 711b appropriately.

For example, in the case where a hafnium oxide layer is formed by a deposition apparatus using an ALD method, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. In this case, the first source material gas supplied from the source material supply portion 711a is TDMAH, and the second source material gas supplied from the source material supply portion 711b is ozone. Note that the chemical formula of tetrakis(dimethylamide)hafnium is $Hf[N(CH_3)_2]_4$. Examples of another material liquid include tetrakis(ethylmethylamide)hafnium. Note that as described in Embodiment 1, nitrogen has a function of eliminating charge trap states. Therefore, when the source material gas includes nitrogen, a hafnium oxide film having low density of charge trap states can be formed.

For example, in the case where an aluminum oxide layer is formed by a deposition apparatus utilizing an ALD method, two kinds of gases, e.g., $H_2O$ as an oxidizer and a source material gas which is obtained by vaporizing liquid containing a solvent and an aluminum precursor compound (e.g., trimethylaluminum (TMA)) are used. In this case, the first source material gas supplied from the source material supply portion 711a is TMA, and the second source material gas supplied from the source material supply portion 711b is $H_2O$. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a tungsten layer is formed using a deposition apparatus utilizing an ALD method, a $WF_6$ gas and a $B_2H_6$ gas are sequentially introduced a plurality of times to form an initial tungsten layer, and then a $WF_6$ gas and an $H_2$ gas are introduced at a time, so that a tungsten layer is formed. Note that an $SiH_4$ gas may be used instead of a $B_2H_6$ gas. These gases may be controlled by a mass flow controller.

Figure 3B:
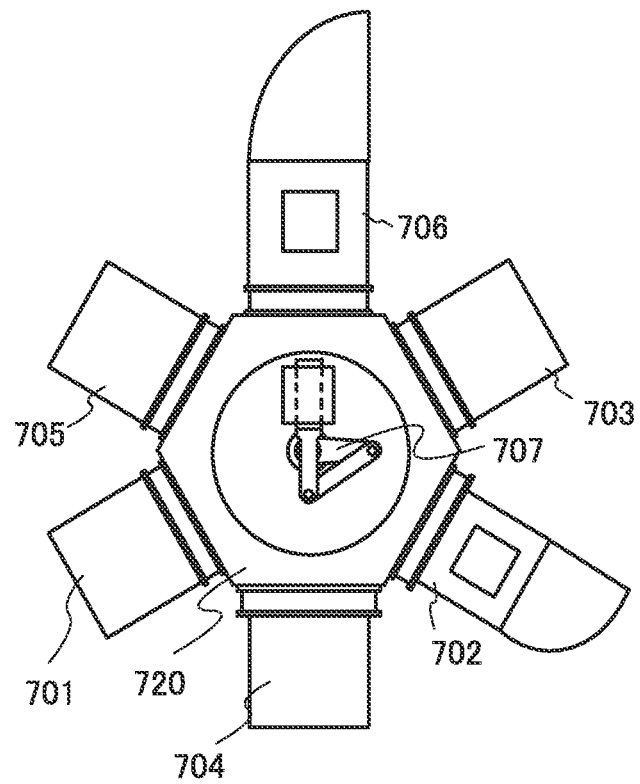

FIG. 3B illustrates an example of a multi-chamber manufacturing apparatus including at least one deposition apparatus illustrated in FIG. 3A.

In the manufacturing apparatus illustrated in FIG. 3B, a stack of films can be successively formed without exposure to the air, and entry of impurities is prevented and throughput is improved.

The manufacturing apparatus illustrated in FIG. 3B includes at least a load chamber 702, a transfer chamber 720, a pretreatment chamber 703, a chamber 701 which is a deposition chamber, and an unload chamber 706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, more preferably maintain reduced pressure.

The chambers 704 and 705 may be deposition apparatuses utilizing an ALD method like the chamber 701, deposition apparatuses utilizing a plasma CVD method, deposition apparatuses utilizing a sputtering method, or deposition apparatuses utilizing a metal organic chemical vapor deposition (MOCVD) method.

For example, an example in which a stack of films is formed under a condition that the chamber 704 is a deposition apparatus utilizing a plasma CVD method and the chamber 705 is a deposition apparatus utilizing an MOCVD method is shown below.

First, a plurality of substrates over each of which an oxide semiconductor layer is provided are set in the load chamber 702. Next, the substrate is transferred to the pretreatment chamber 703 by a transfer unit 707 of the transfer chamber 720. In the pretreatment chamber 703, treatment for cleaning the surface of the substrate is performed. Next, the substrate whose surface is cleaned is transferred to the chamber 704 without exposure to the air, and a silicon oxide layer is formed. Next, the substrate is transferred to the chamber 701 by the transfer unit 707 without exposure to the air, and a hafnium oxide layer is formed. Next, the substrate is transferred to the chamber 705 by the transfer unit 707 without exposure to the air, and a tungsten layer is formed. Then, the substrate is transferred to the unload chamber 706 by the transfer unit 707. Through the above procedure, the silicon oxide layer over the oxide semiconductor layer, the hafnium oxide layer over the silicon oxide layer, and the tungsten layer over the hafnium oxide layer can be formed.

Although the example in which a stacked film is formed using three kinds of deposition apparatuses is described here, there is no limitation thereto. For example, the oxide semiconductor layer 104, the gate insulating layer 108, and the gate electrode layer 110 which are described in Embodiment 1 may be successively formed. Furthermore, layers described in the other embodiments may be formed using the manufacturing apparatus described in this embodiment.

Although FIG. 3B shows an example in which a top surface shape of the transfer chamber 720 is a hexagon, a manufacturing apparatus in which the top surface shape is set to a polygon having more than six corners and more chambers are connected depending on the number of layers of a stack may be used. The top surface shape of the substrate is rectangular in FIG. 3B; however, there is no particular limitation on the top surface shape of the substrate. Although FIG. 3B shows an example of the single wafer type, a batch-type deposition apparatus in which a plurality of substrates are formed at a time may be used.

Embodiment 3

In this embodiment, a semiconductor device of one embodiment of the present invention is described with reference to drawings.

<Transistor Structure 1>

Figure 4A:
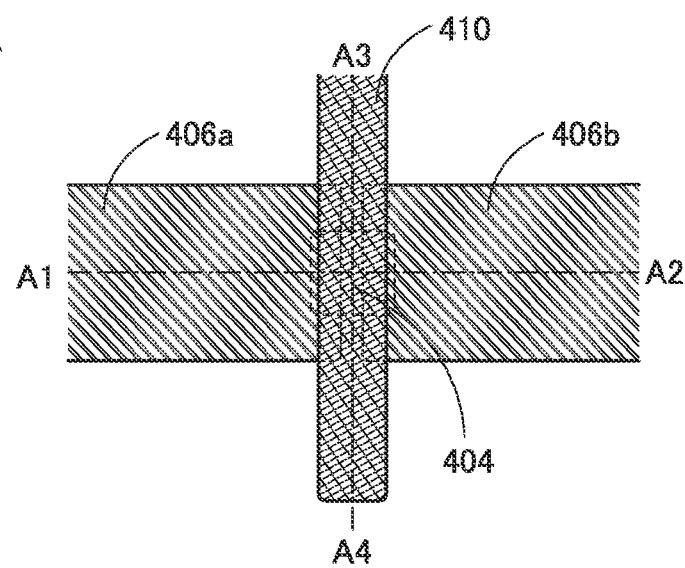
FIGS. 4A to 4C are a top view and cross-sectional views which illustrate a transistor of one embodiment of the present invention.
Figure 4B:
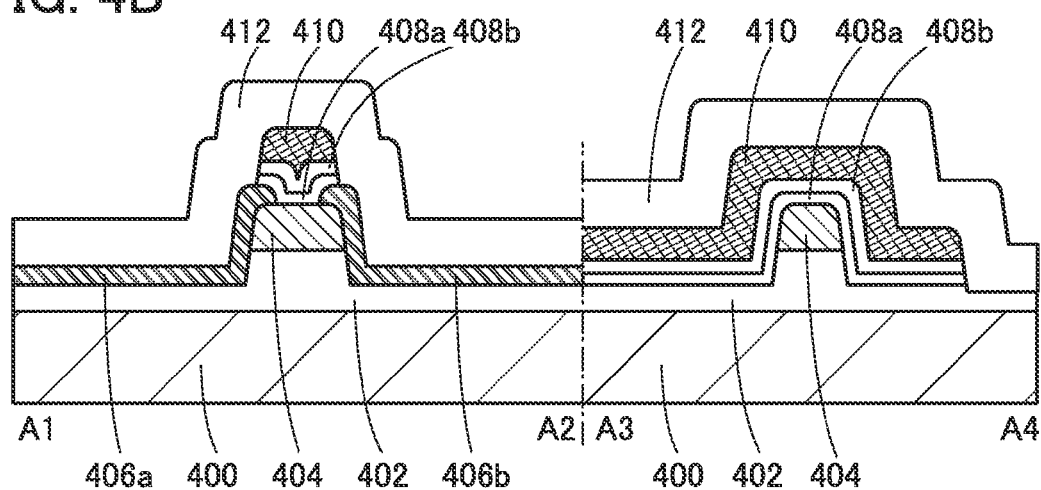

FIGS. 4A and 4B are a top view and a cross-sectional view of a transistor of one embodiment of the present invention. FIG. 4A is a top view and FIG. 4B is a cross-sectional view taken along dashed-dotted line A1-A2 and dashed-dotted line A3-A4 in FIG. 4A. Note that for simplification of the drawing, some components in the top view in FIG. 4A are not illustrated.

The transistor illustrated in FIGS. 4A and 4B includes a base insulating layer 402 having a projecting portion over a substrate 400, an oxide semiconductor layer 404 over the projecting portion of the base insulating layer 402, a source electrode layer 406a and a drain electrode layer 406b in contact with a top surface and side surfaces of the oxide semiconductor layer 404, a gate insulating layer 408a over the oxide semiconductor layer 404, the source electrode layer 406a, and the drain electrode layer 406b, a gate insulating layer 408b over the gate insulating layer 408a, a gate electrode layer 410 which is in contact with a top surface of the gate insulating layer 408b and faces the top surface and the side surfaces of the oxide semiconductor layer 404, and an insulating layer 412 over the source electrode layer 406a, the drain electrode layer 406b, and the gate electrode layer 410. Note that the base insulating layer 402 does not necessarily include a projecting portion.

In the transistor illustrated in FIGS. 4A and 4B, the gate insulating layer 408b is an insulating layer which is formed by selecting a material and/or a formation method to include charge trap states and which includes negative fixed charges and/or charge trap states (trap centers) trapping negative charges. For the details thereof, the description of the gate insulating layer 108b in Embodiment 1 can be referred to. Note that the gate insulating layer 408b may be either a single layer or a stacked layer.

The gate insulating layer 408a between the gate insulating layer 408b and the oxide semiconductor layer 404 is an insulating layer which has density of negative fixed charges and/or charge trap states trapping negative charges lower than that of the gate insulating layer 408b. For the details thereof, the description of the gate insulating layer 108a in Embodiment 1 can be referred to. Note that the gate insulating layer 408a may be either a single layer or a stacked layer.

In the transistor illustrated in FIGS. 4A and 4B, the gate insulating layer 408b includes negative fixed charges or trap centers, and the negative fixed charges or the trap centers are apart from the oxide semiconductor layer 404 with the use of the gate insulating layer 408a. Thus, by performing charge trapping treatment on the transistor, the transistor in which the threshold voltage is shifted in the positive direction and the shift after that is suppressed and which has stable electrical characteristics can be provided.

Although FIGS. 4A and 4B show an example of a transistor having a stacked-layer structure of the gate insulating layer 408a and the gate insulating layer 408b, this embodiment is not limited thereto. An insulating layer corresponding to the gate insulating layer 108d in Embodiment 1 may be provided between the gate insulating layer 408a and the oxide semiconductor layer 404, or an insulating layer corresponding to the gate insulating layer 108c in Embodiment 1 may be provided between the gate insulating layer 408b and the gate electrode layer 410.

As illustrated in FIG. 4B, side surfaces of the source electrode layer 406a and the drain electrode layer 406b are in contact with the side surfaces of the oxide semiconductor layer 404. The oxide semiconductor layer 404 can be electrically surrounded by an electric field of the gate electrode layer 410 (a structure in which an oxide semiconductor layer is electrically surrounded by an electric field of a gate electrode layer is referred to as a surrounded channel (s-channel) structure). Therefore, a channel is formed in the entire oxide semiconductor layer 404 (bulk). In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Note that a channel length refers to a distance between a source (a source region or a source electrode layer) and a drain (a drain region or a drain electrode layer) in a region where a semiconductor layer and a gate electrode layer overlap with each other in a top view. Accordingly, in FIG. 4A, a channel length is a distance between the source electrode layer 406a and the drain electrode layer 406b in a region where the oxide semiconductor layer 404 and the gate electrode layer 410 overlap with each other. A channel width refers to the width of a source or a drain in a region where a semiconductor layer overlaps with a gate electrode layer. Accordingly, in FIG. 4A, a channel width (W) is the width of the source electrode layer 406a or the drain electrode layer 406b in a region where the oxide semiconductor layer 404 overlaps with the gate electrode layer 410.

The substrate 400 is not limited to a simple support, and may be a substrate where an element such as a transistor or a capacitor is formed. In that case, at least one of the gate electrode layer 410, the source electrode layer 406a, and the drain electrode layer 406b of the transistor may be electrically connected to the above element.

The base insulating layer 402 can have a function of supplying oxygen to the oxide semiconductor layer 404 as well as a function of preventing diffusion of impurities from the substrate 400. Thus, the base insulating layer 402 is preferably an insulating layer containing oxygen. For example, an insulating layer containing oxygen more than that in the stoichiometric composition is more preferable. Note that in the case where the substrate 400 is a substrate where an element is formed as described above, the base insulating layer 402 has also a function as an interlayer insulating layer. In that case, a surface of the base insulating layer 402 may be planarized. For example, the base insulating layer 402 may be subjected to planarization treatment such as chemical mechanical polishing (CMP) treatment.

The oxide semiconductor layer 404 is described in detail below.

The oxide semiconductor layer 404 is an oxide containing indium. An oxide can have high carrier mobility (electron mobility) by containing indium, for example. In addition, the oxide semiconductor layer 404 preferably includes an element M. The element M is aluminum, gallium, yttrium, or tin, for example. The element M is an element having high bonding energy with oxygen, for example. The element M is an element that can increase the energy gap of the oxide, for example. In addition, the oxide semiconductor layer 404 preferably contains zinc. When the oxide contains zinc, the oxide is easily crystallized, for example. The energy at the top of the valence band of the oxide can be controlled with the atomic ratio of zinc, for example.

Note that the oxide semiconductor layer 404 is not limited to the oxide containing indium. The oxide semiconductor layer 404 may be a Zn—Sn oxide or a Ga—Sn oxide, for example.

As the oxide semiconductor layer 404, an oxide with a wide energy gap is used. For example, the energy gap of the oxide semiconductor layer 404 is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the oxide semiconductor layer 404 is formed by a sputtering method, a target containing indium is preferably used in order to reduce the number of particles.

In addition, if an oxide target having a high atomic ratio of the element M is used, the conductivity of the target may be decreased. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor layer 404 is formed by a sputtering method, the atomic ratio of In to M and Zn contained in the target may be 3:1:1, 3:1:2, 3:1:4, 1:1:0.5, 1:1:1, 1:1:2, or the like.

In the case where the oxide semiconductor layer 404 is formed by a sputtering method, a film having an atomic ratio different from the atomic ratio of the target used may be formed. Especially for zinc, the atomic ratio of zinc in a deposited film is smaller than the atomic ratio of the target in some cases. Specifically, the proportion of zinc in the film is 40 atomic % to 90 atomic % of that of zinc in the target in some cases.

An influence of impurities in the oxide semiconductor layer 404 is described below. In order to obtain stable electrical characteristics of a transistor, it is effective to reduce the concentration of impurities in the oxide semiconductor layer 404 to have lower carrier density so that the oxide semiconductor layer 404 is highly purified. The carrier density of the oxide semiconductor layer 404 is set to be lower than $1\times10^{17}/cm^3$, lower than $1\times10^{15}/cm^3$, or lower than $1\times10^{13}/cm^3$. In order to reduce the concentration of impurities in the oxide semiconductor layer 404, the concentration of impurities in a film which is adjacent to the oxide semiconductor layer 404 are preferably reduced.

For example, silicon in the oxide semiconductor layer 404 might serve as a carrier trap or a carrier generation source. Therefore, the concentration of silicon in a region between the oxide semiconductor layer 404 and the base insulating layer 402 measured by secondary ion mass spectrometry (SIMS) is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor layer 404 and the gate insulating layer 408a measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor layer 404, the carrier density is increased in some cases. The concentration of hydrogen in the oxide semiconductor layer 404 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor layer 404, the carrier density is increased in some cases. The concentration of nitrogen in the oxide semiconductor layer 404 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the base insulating layer 402 in order to reduce the concentration of hydrogen in the oxide semiconductor layer 404. The concentration of hydrogen in the base insulating layer 402 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5 \times 10^{18}$ atoms/cm$^3$. It is preferable to reduce the concentration of nitrogen in the base insulating layer 402 in order to reduce the concentration of nitrogen in the oxide semiconductor layer 404. The concentration of nitrogen in the base insulating layer 402 measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

It is preferable to reduce the concentration of hydrogen in the gate insulating layer 408a in order to reduce the concentration of hydrogen in the oxide semiconductor layer 404. The concentration of hydrogen in the gate insulating layer 408a measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the gate insulating layer 408a in order to reduce the concentration of nitrogen in the oxide semiconductor layer 404. The concentration of nitrogen in the gate insulating layer 408a measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

A structure of an oxide semiconductor layer which can be used as the oxide semiconductor layer 404 is described below.

An oxide semiconductor layer is classified roughly into a single-crystal oxide semiconductor layer and a non-single-crystal oxide semiconductor layer. The non-single-crystal oxide semiconductor layer includes any of a c-axis aligned crystalline oxide semiconductor (CAAC-OS) layer, a poly-crystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of crystal parts, and most of the crystal parts each fit inside a cube whose one side is less than 100 nm. Thus, there is a case where a crystal part included in the CAAC-OS layer fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

In this specification, the trigonal and rhombohedral crystal systems are included in the hexagonal crystal system.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Furthermore, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ not appear at around 36°.

The CAAC-OS layer is an oxide semiconductor layer with low impurity concentration. The impurity means an element other than the main components of the oxide semiconductor layer, such as hydrogen, carbon, silicon, or a transition metal element. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Furthermore, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity. Note that the impurity contained in the oxide semiconductor layer might become a carrier trap or a carrier generation source.

The CAAC-OS layer is an oxide semiconductor layer with a low density of defect states. For example, oxygen vacancies in the oxide semiconductor layer serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly-purified intrinsic or substantially highly-purified intrinsic oxide semiconductor layer has few carrier generation sources, and thus can have a low carrier density. Thus, a transistor using the oxide semiconductor layer rarely has a negative threshold voltage (rarely has normally-on characteristics). A highly-purified intrinsic or substantially highly-purified intrinsic oxide semiconductor layer has few carrier traps. Accordingly, the transistor using the oxide semiconductor layer has a small change in electrical characteristics and high reliability. Note that charges trapped in the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

In a transistor using the CAAC-OS layer, change in electrical characteristics due to irradiation with visible light or ultraviolet light is small.

Next, a microcrystalline oxide semiconductor layer is described.

In an image obtained with a TEM, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly observed in some cases.

In the nc-OS layer, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS layer does not have regularity of crystal orientation between different crystal parts. Thus, the orientation of the whole film is not observed.

Accordingly, in some cases, the nc-OS layer cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., larger than or equal to 50 nm) larger than the diameter of a crystal part. Meanwhile, spots are shown in a nanobeam electron diffraction pattern of the nc-OS layer obtained by using an electron beam having a probe diameter (e.g., larger than or equal to 1 nm and smaller than or equal to 30 nm) close to, or smaller than the diameter of a crystal part. Furthermore, in a nanobeam electron diffraction pattern of the nc-OS layer, regions with high luminance in a circular (ring) pattern are shown in some cases. Also in a nanobeam electron diffraction pattern of the nc-OS layer, a plurality of spots are shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer, hence, the nc-OS layer has a higher density of defect states than the CAAC-OS layer.

Note that an oxide semiconductor layer may be a stacked film including two or more layers of an amorphous oxide semiconductor layer, a microcrystalline oxide semiconductor layer, and a CAAC-OS layer, for example.

The oxide semiconductor layer 404 may be a stack of oxide semiconductor layers. For example, the oxide semiconductor layer 404 may have a two-layer structure or a three-layer structure.

Figure 4C:
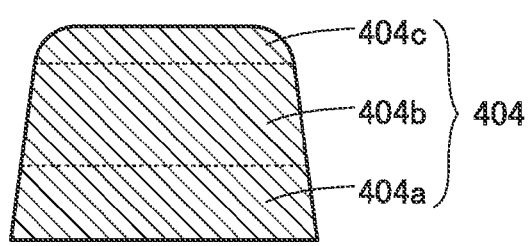

For example, the case where the oxide semiconductor layer 404 has a three-layer structure is described. In FIG. 4C, the oxide semiconductor layer 404 is a film in which an oxide semiconductor layer 404a, an oxide semiconductor layer 404b, and an oxide semiconductor layer 404c are stacked in this order.

For the oxide semiconductor layer 404b (middle layer), the above description of the oxide semiconductor layer 404 can be referred to. The oxide semiconductor layer 404a (bottom layer) and the oxide semiconductor layer 404c (top layer) include one or more elements other than oxygen included in the oxide semiconductor layer 404b. Since the oxide semiconductor layer 404a and the oxide semiconductor layer 404c each include one or more elements other than oxygen included in the oxide semiconductor layer 404b, an interface state is less likely to be formed at the interface between the oxide semiconductor layer 404a and the oxide semiconductor layer 404b and the interface between the oxide semiconductor layer 404b and the oxide semiconductor layer 404c.

In the case of using an In-M-Zn oxide as the oxide semiconductor layer 404a, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case of using an In-M-Zn oxide as the oxide semiconductor layer 404b, when summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case of using an In-M-Zn oxide as the oxide semiconductor layer 404c, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the oxide semiconductor layer 404c may be an oxide that is a type the same as that of the oxide semiconductor layer 404a.

Here, in some cases, there is a mixed region of the oxide semiconductor layer 404a and the oxide semiconductor layer 404b between the oxide semiconductor layer 404a and the oxide semiconductor layer 404b. Further, in some cases, there is a mixed region of the oxide semiconductor layer 404b and the oxide semiconductor layer 404c between the oxide semiconductor layer 404b and the oxide semiconductor layer 404c. The mixed region has a low interface state density. For that reason, the stack of the oxide semiconductor layer 404a, the oxide semiconductor layer 404b, and the oxide semiconductor layer 404c has a band structure where energy at each interface and in the vicinity of the interface is changed continuously (continuous junction).

As the oxide semiconductor layer 404b, an oxide having an electron affinity higher than those of the oxide semiconductor layers 404a and 404c is used. For example, as the oxide semiconductor layer 404b, an oxide having an electron affinity higher than those of the oxide semiconductor layers 404a and 404c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

At this time, when an electric field is applied to the gate electrode layer 410, a channel is formed in the oxide semiconductor layer 404b having the highest electron affinity in the oxide semiconductor layer 404a, the oxide semiconductor layer 404b, and the oxide semiconductor layer 404c.

Moreover, the thickness of the oxide semiconductor layer 404c is preferably as small as possible to increase the on-state current of the transistor. The thickness of the oxide semiconductor layer 404c is set to be less than 10 nm, preferably less than or equal to 5 nm, further preferably less than or equal to 3 nm, for example. Meanwhile, the oxide semiconductor layer 404c has a function of blocking elements other than oxygen (such as silicon) included in the gate insulating layer 408a from entering the oxide semiconductor layer 404b where a channel is formed. For this reason, it is preferable that the oxide semiconductor layer 404c have a certain thickness. The thickness of the oxide semiconductor layer 404c is set to be greater than or equal to 0.3 nm, preferably greater than or equal to 1 nm, further preferably greater than or equal to 2 nm, for example.

To improve reliability, preferably, the thickness of the oxide semiconductor layer 404a is large and the thickness of the oxide semiconductor layer 404c is small. Specifically, the thickness of the oxide semiconductor layer 404a is set to be greater than or equal to 20 nm, preferably greater than or equal to 30 nm, further preferably greater than or equal to 40 nm, still further preferably greater than or equal to 60 nm. With the oxide semiconductor layer 404a having a thickness greater than or equal to 20 nm, preferably greater than or equal to 30 nm, further preferably greater than or equal to 40 nm, still further preferably greater than or equal to 60 nm, the distance from the interface between the base insulating layer 402 and the oxide semiconductor layer 404a to the oxide semiconductor layer 404b where the channel is formed can be greater than or equal to 20 nm, preferably greater than or equal to 30 nm, further preferably greater than or equal to 40 nm, still further preferably greater than or equal to 60 nm. Note that since the productivity of a semiconductor device might be reduced, the thickness of the oxide semiconductor layer 404a is set to be less than or equal to 200 nm, preferably less than or equal to 120 nm, further preferably less than or equal to 80 nm.

For example, the concentration of silicon in a region between the oxide semiconductor layer 404b and the oxide semiconductor layer 404a measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. The concentration of silicon in a region between the oxide semiconductor layer 404b and the oxide semiconductor layer 404c measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$.

It is preferable to reduce the concentration of hydrogen in the oxide semiconductor layer 404a and the oxide semiconductor layer 404c in order to reduce the concentration of hydrogen in the oxide semiconductor layer 404b. The concentration of hydrogen in the oxide semiconductor layer 404a and the oxide semiconductor layer 404c measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the oxide semiconductor layer 404a and the oxide semiconductor layer 404c in order to reduce the concentration of nitrogen in the oxide semiconductor layer 404b. The concentration of nitrogen in the oxide semiconductor layer 404a and the oxide semiconductor layer 404c measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The above three-layer structure is an example of the semiconductor layer 404. For example, a two-layer structure without the oxide semiconductor layer 404a or the oxide semiconductor layer 404c may be employed.

As the source electrode layer 406a and the drain electrode layer 406b illustrated in FIGS. 4A and 4B, a conductive layer capable of extracting oxygen from the oxide semiconductor layer is preferably used. As an example of the conductive layer capable of extracting oxygen from the oxide semiconductor layer, a conductive layer containing aluminum, titanium, chromium, nickel, molybdenum, tantalum, tungsten, or the like can be given.

By the conductive layer capable of extracting oxygen from the oxide semiconductor layer, oxygen in the oxide semiconductor layer is released to form oxygen vacancies in the oxide semiconductor layer in some cases. Oxygen is more likely to be extracted as the temperature is higher. Since the manufacturing process of the transistor involves some heat treatment steps, oxygen vacancies in a region of the oxide semiconductor layer, which is in contact with the source electrode layer or the drain electrode layer, are likely formed due to the above-mentioned action. Furthermore, hydrogen enters sites of oxygen vacancies by heating, and thus the oxide semiconductor layer becomes n-type in some cases. Thus, due to the source electrode layer and the drain electrode layer, the resistance of a region where the oxide semiconductor layer is in contact with the source electrode layer or the drain electrode layer is reduced, so that the on-state resistance of the transistor can be reduced.

In the case where a transistor with a short channel length (e.g. less than or equal to 200 nm, or less than or equal to 100 nm) is manufactured, a source and a drain might be short-circuited due to formation of an n-type region. Therefore, in the case where a transistor with a short channel length is manufactured, a conductive layer capable of appropriately extracting oxygen from an oxide semiconductor layer may be used as the source electrode layer and the drain electrode layer. As the conductive layer capable of appropriately extracting oxygen, a conductive layer containing nickel, molybdenum, or tungsten can be used, for example.

Furthermore, in the case where a transistor with an extremely short channel length (less than or equal to 40 nm, or less than or equal to 30 nm) is manufactured, a conductive layer which is less likely to extract oxygen from an oxide semiconductor layer may be used as the source electrode layer $406a$ and the drain electrode layer $406b$. As an example of the conductive layer which is less likely to extract oxygen from an oxide semiconductor layer, a conductive layer containing tantalum nitride, titanium nitride, or ruthenium can be given. Note that plural kinds of conductive layers may be stacked.

The gate electrode layer 410 may be formed using a conductive layer containing one or more of aluminum, titanium, chromium, cobalt, nickel, copper, yttrium, zirconium, molybdenum, ruthenium, silver, tantalum, tungsten, and the like.

The insulating layer 412 can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

The transistor illustrated in FIGS. 4A and 4B is a transistor whose threshold voltage is controlled by the gate insulating layer $408a$ and the gate insulating layer $408b$. A normally-off transistor whose threshold voltage is fixed to a positive value is preferable.

Next, a method for manufacturing the transistor is described with reference to FIGS. 5A to 5C and FIGS. 6A to 6C.

Figure 5A:
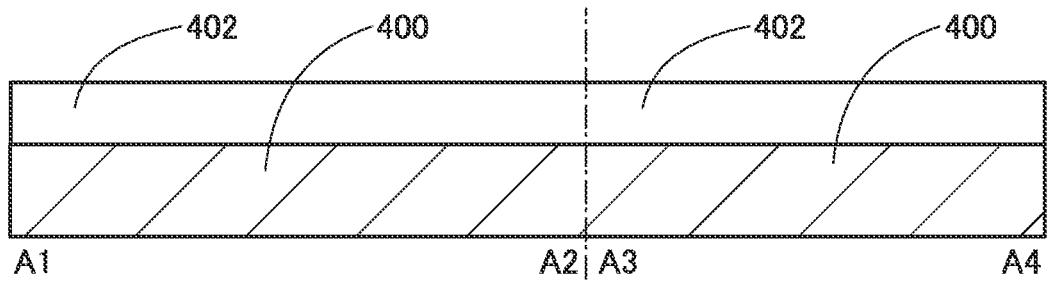
FIGS. 5A to 5C are cross-sectional views illustrating a method for manufacturing a transistor of one embodiment of the present invention.

First, the base insulating layer 402 is formed over the substrate 400 (see FIG. 5A).

The base insulating layer 402 may be formed by a sputtering method, a CVD method, a molecular beam epitaxy (MBE) method, an ALD method, or a pulsed laser deposition (PLD) method.

Then, in order to planarize the surface of the base insulating layer 402, CMP treatment may be performed. By CMP treatment, the average surface roughness (Ra) of the base insulating layer 402 is less than or equal to 1 nm, preferably less than or equal to 0.3 nm, more preferably less than or equal to 0.1 nm. In some cases, Ra that is less than or equal to the above value can increase the crystallinity of the oxide semiconductor layer 404. Ra can be measured using an atomic force microscope (AFM).

Then, oxygen may be added to the base insulating layer 402 so that an insulating layer containing excess oxygen can be formed. Oxygen may be added by plasma treatment, an ion implantation method, or the like. In the case where the addition of oxygen may be performed by an ion implantation method, the acceleration voltage may be higher than or equal to 2 kV and lower than or equal to 100 kV and the dose is greater than or equal to $5 \times 10^{14}$ ions/cm$^2$ and less than or equal to $5 \times 10^{16}$ ions/cm$^2$, for example.

Figure 5B:
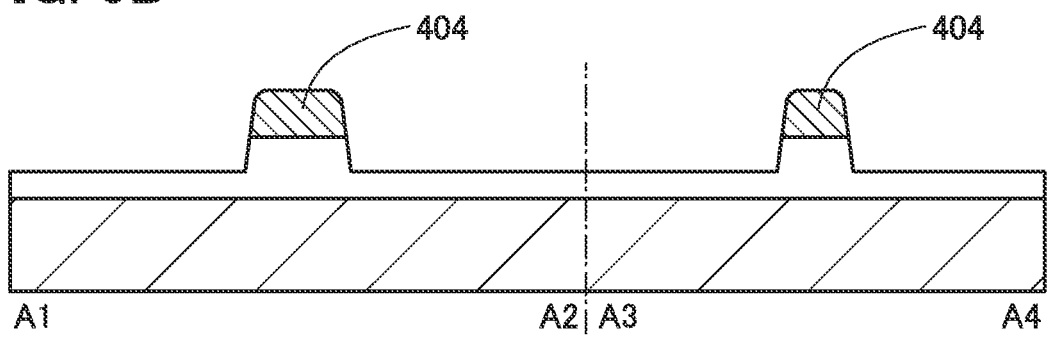

Next, the oxide semiconductor layer 404 is formed over the base insulating layer 402 by a sputtering method, a CVD method, an MBE method, an ALD method, or a PLD method (see FIG. 5B). At this time, the base insulating layer 402 may be appropriately etched. By etching the base insulating layer 402 appropriately, the gate electrode layer 410 to be formed later can cover the oxide semiconductor layer 404 easily. Note that in order to miniaturize the transistor, a hard mask may be used in processing the oxide semiconductor layer 404.

Furthermore, in the case where a stacked layer including the oxide semiconductor layer $404a$, the oxide semiconductor layer $404b$, and the oxide semiconductor layer $404c$ is formed as the oxide semiconductor layer 404, it is preferable that the layers be successively formed without exposure to the air.

In order to obtain an oxide semiconductor layer in which entry of impurities is decreased and which has high crystallinity, the oxide semiconductor layer 404 is formed at a substrate temperature of higher than or equal to 100° C., preferably higher than or equal to 150° C., more preferably higher than or equal to 200° C. As an oxygen gas or an argon gas used as a deposition gas, a highly purified gas whose dew point is lower than or equal to −40° C., preferably lower than or equal to −80° C., more preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor layer 404 is formed. The first heat treatment may be performed at a temperature higher than or equal to 250° C. and lower than or equal to 650° C. preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404 can be improved, and in addition, impurities such as hydrogen and water can be removed from the base insulating layer 402.

Figure 5C:
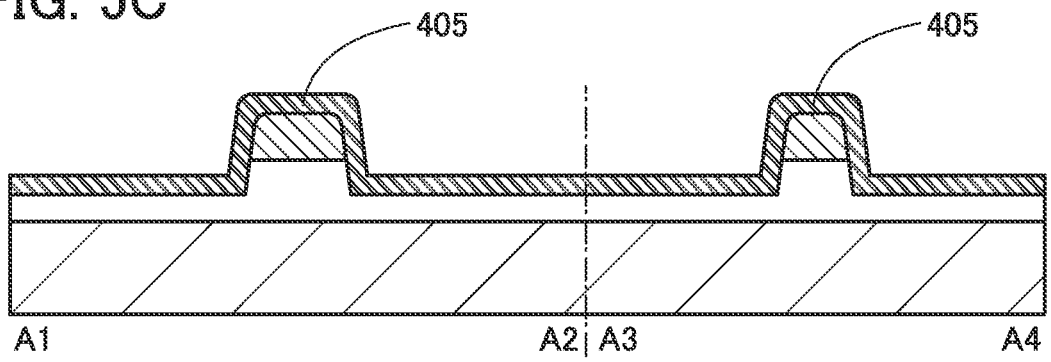

Next, a conductive layer 405 to be the source electrode layer $406a$ and the drain electrode layer $406b$ is formed over the oxide semiconductor layer 404 (see FIG. 5C). The conductive layer 405 may be formed by a sputtering method, a CVD method, an MBE method, an ALD method, or a PLD method.

Figure 6A:
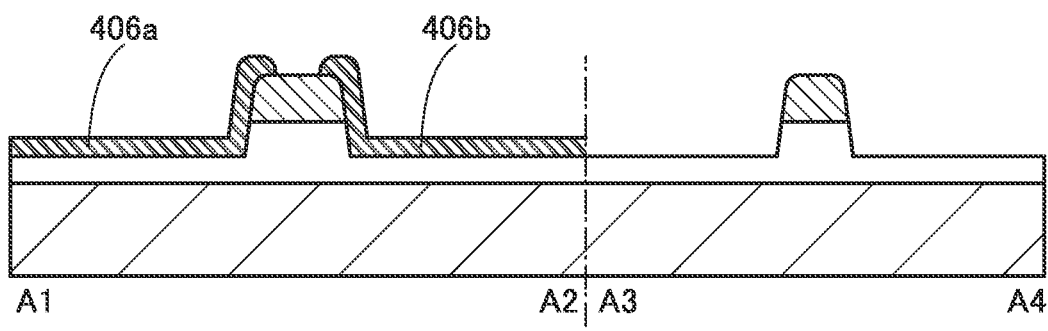
FIGS. 6A to 6C are cross-sectional views illustrating a method for manufacturing a transistor of one embodiment of the present invention.

Next, the conductive layer 405 is divided by etching to form the source electrode layer $406a$ and the drain electrode layer $406b$ (see FIG. 6A). Note that when the conductive layer 405 is etched, end portions of the source electrode layer $406a$ and the drain electrode layer $406b$ are rounded (curved) in some cases. Furthermore, when the conductive layer 405 is etched, the base insulating layer 402 may be etched appropriately.

Next, the gate insulating layer $408a$ is formed over the oxide semiconductor layer 404, the source electrode layer $406a$, and the drain electrode layer $406b$. The gate insulating layer $408a$ may be formed by a sputtering method, a CVD method, or an ALD method. The gate insulating layer 408a is, for example, an insulating layer formed using an oxide (including a composite oxide) containing one or more elements selected from hafnium, aluminum, tantalum, and the like to which impurities (at least one selected from nitrogen, zirconium, and lanthanoid) having a function of making charge trap states which might be included in the insulating layer disappear are added. The impurities may be introduced into an insulating layer by an ion implantation method or an ion doping method after the insulating layer formed using an oxide (including a composite oxide) containing one or more elements selected from hafnium, aluminum, tantalum, and the like is formed by a sputtering method or an ALD method, or may be introduced into an insulating layer by making a gas containing nitrogen, zirconium, or lanthanoid flow in formation of the insulating layer.

Next, the gate insulating layer 408b is formed over the gate insulating layer 408a. The gate insulating layer 408b may be formed by a sputtering method, a CVD method, or an ALD method. Note that the gate insulating layer 408b is formed at a substrate temperature of higher than or equal to 100° C., preferably higher than or equal to 150° C. which enables reduction in entry of water. The gate insulating layer 408b is an insulating layer formed using an oxide (including a composite oxide) containing one or more elements selected from hafnium, aluminum, tantalum, and the like.

Next, second heat treatment may be performed. The second heat treatment may be performed at a temperature lower than 500° C. preferably lower than 400° C., in an inert gas atmosphere, an atmosphere containing an oxidizing gas at 10 ppm or more, or a reduced pressure state. Alternatively, the second heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the second heat treatment, impurities such as hydrogen and water can be removed from the gate insulating layer 408b.

Figure 6B:
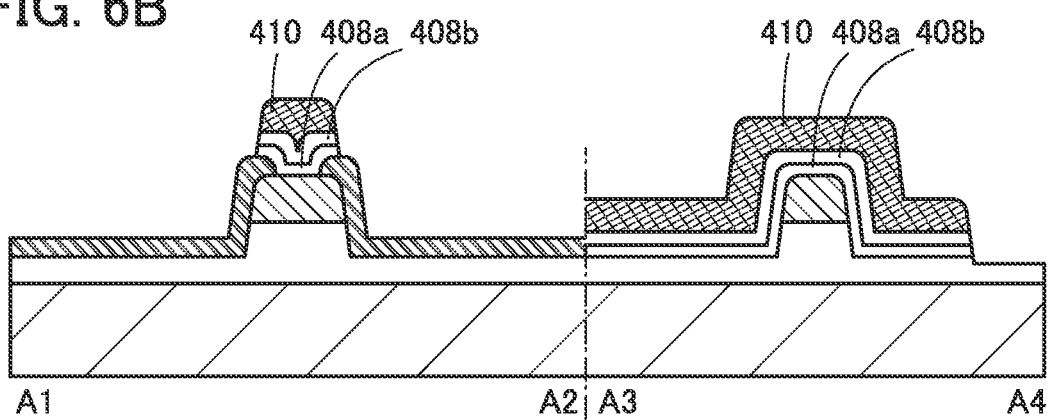

Next, the gate electrode layer 410 is formed over the gate insulating layer 408b (see FIG. 6B).

Figure 6C:
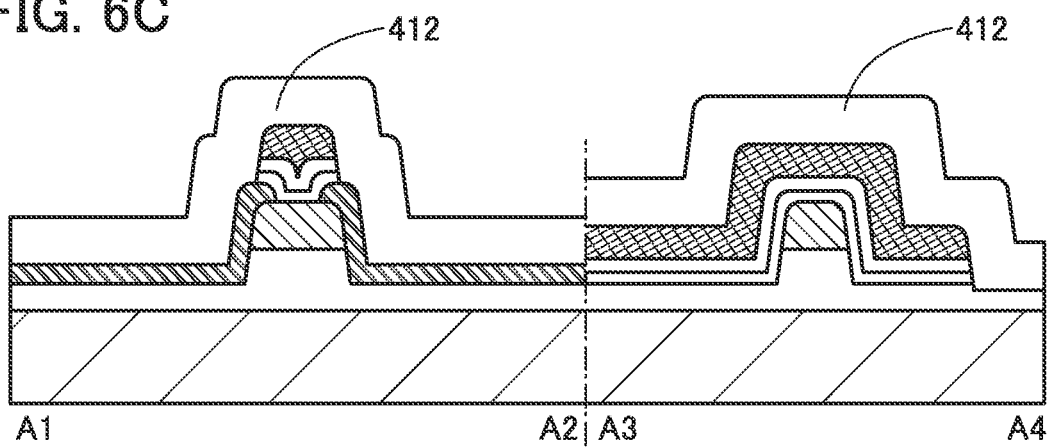

Next, the insulating layer 412 is formed over the source electrode layer 406a, the drain electrode layer 406b, the gate insulating layer 408a, the gate insulating layer 408b, and the gate electrode layer 410 (see FIG. 6C). The insulating layer 412 may be formed by a sputtering method, a CVD method, an MBE method, an ALD method, or a PLD method.

Next, third heat treatment may be performed. The third heat treatment can be performed under conditions similar to those of the first heat treatment. The third heat treatment allows reducing oxygen vacancies in the oxide semiconductor layer 404 in some cases.

Through the above steps, the transistor illustrated in FIGS. 4A and 4B can be manufactured.

<Modification Example of Transistor Structure 1>

Figure 7A:
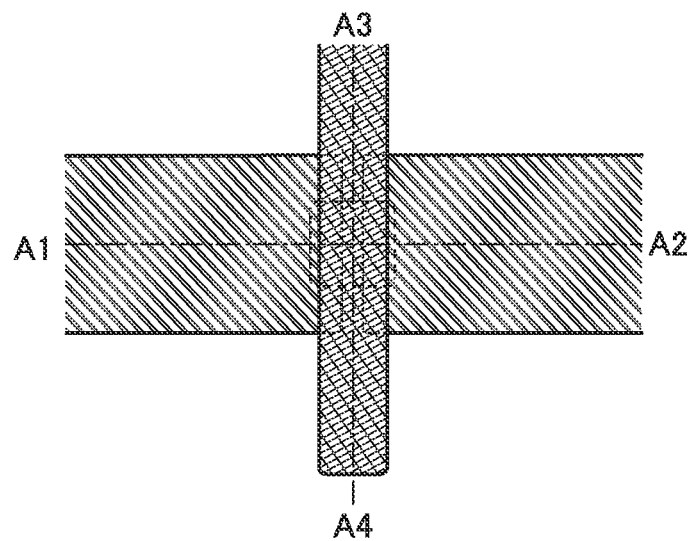
FIGS. 7A and 7B are a top view and a cross-sectional view illustrating a transistor of one embodiment of the present invention.
Figure 7B:
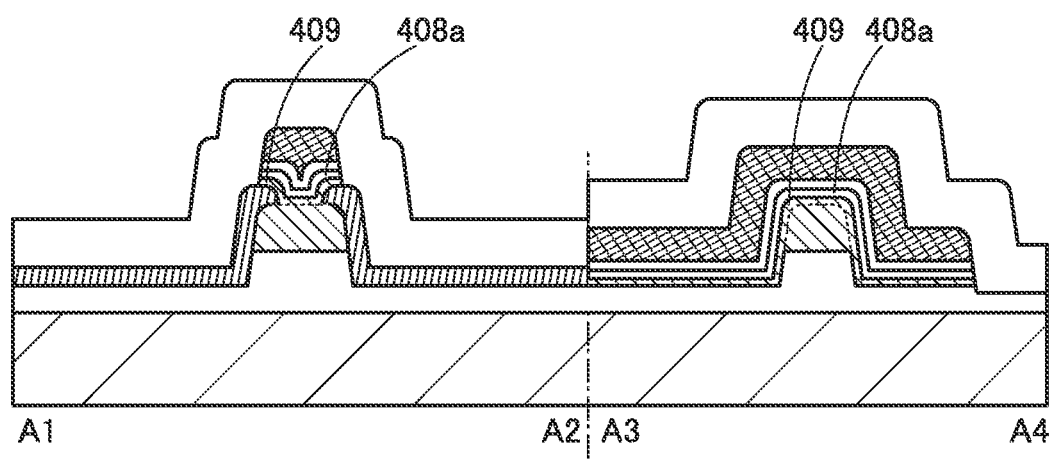

As in a transistor illustrated in FIGS. 7A and 7B, an oxide layer 409 may be provided under the gate insulating layer 408a. As the oxide layer 409, the oxide semiconductor layer shown as the oxide semiconductor layer 404c may be used. Note that the description of the transistor illustrated in FIGS. 4A and 4B is referred to for the structures of the other components.

<Transistor Structure 2>

Figure 8A:
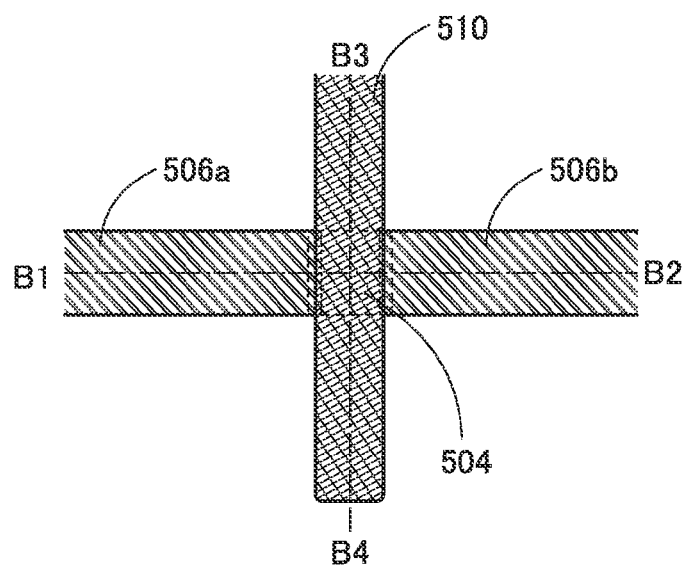
FIGS. 8A and 8B are a top view and a cross-sectional view illustrating a transistor of one embodiment of the present invention.
Figure 8B:
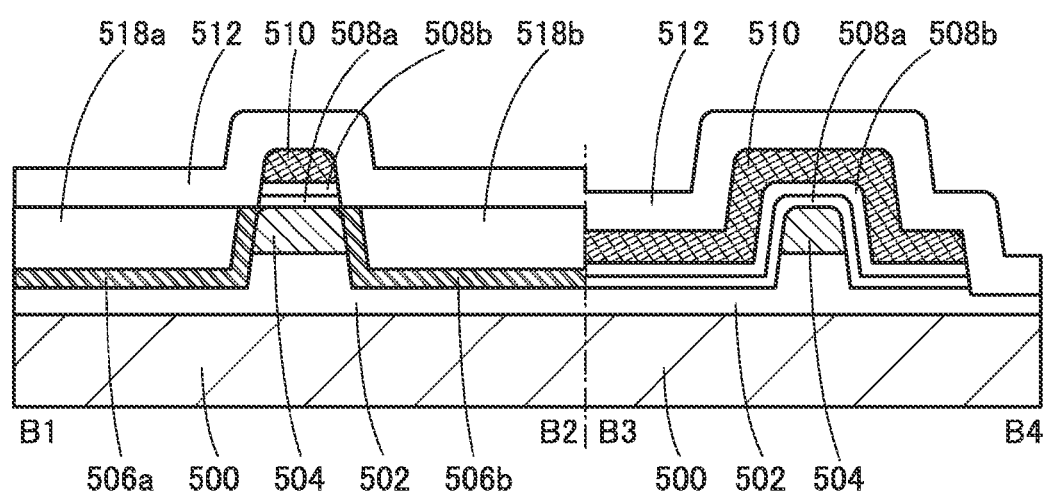

FIGS. 8A and 8B are a top view and a cross-sectional view of a transistor of one embodiment of the present invention. FIG. 8A is a top view and FIG. 8B is a cross-sectional view taken along dashed-dotted line B1-B2 and dashed-dotted line B3-B4 in FIG. 8A. Note that for simplification of the drawing, some components in the top view in FIG. 8A are not illustrated.

The transistor in FIGS. 8A and 8B includes a base insulating layer 502 having a projecting portion over a substrate 500, an oxide semiconductor layer 504 over the projecting portion of the base insulating layer 502, a source electrode layer 506a and a drain electrode layer 506b in contact with side surfaces of the oxide semiconductor layer 504, an insulating layer 518a and an insulating layer 518b which are over the source electrode layer 506a and the drain electrode layer 506b and the levels of the top surfaces of which are the same as that of the oxide semiconductor layer 504, a gate insulating layer 508a over the oxide semiconductor layer 504, the source electrode layer 506a, and the drain electrode layer 506b, a gate insulating layer 508b over the gate insulating layer 508a, a gate electrode layer 510 which is in contact with a top surface of the gate insulating layer 508b and faces a top surface and the side surfaces of the oxide semiconductor layer 504, and an insulating layer 512 over the source electrode layer 506a, the drain electrode layer 506b, and the gate electrode layer 510. Note that the base insulating layer 502 does not necessarily include a projecting portion.

In the transistor illustrated in FIGS. 8A and 8B, the description of the gate insulating layer 108b in Embodiment 1 can be referred to for the gate insulating layer 508b. Note that the gate insulating layer 508b may be either a single layer or a stacked layer. The description of the gate insulating layer 108a in Embodiment 1 can be referred to for the gate insulating layer 508a. Note that the gate insulating layer 508a may be either a single layer or a stacked layer.

In the transistor illustrated in FIGS. 8A and 8B, the gate insulating layer 508b includes negative fixed charges or trap centers, and the negative fixed charges or the trap centers are apart from the oxide semiconductor layer 504 with the use of the gate insulating layer 508a. Thus, by performing charge trapping treatment on the transistor, the transistor in which the threshold voltage is shifted in the positive direction and the shift after that is suppressed and which has stable electrical characteristics can be provided.

Although FIGS. 8A and 8B show an example of a transistor having a stacked-layer structure of the gate insulating layer 508a and the gate insulating layer 508b, this embodiment is not limited thereto. An insulating layer corresponding to the gate insulating layer 108d in Embodiment 1 may be provided between the gate insulating layer 508a and the oxide semiconductor layer 504, or an insulating layer corresponding to the gate insulating layer 108c in Embodiment 1 may be provided between the gate insulating layer 508b and the gate electrode layer 510.

In the transistor illustrated in FIGS. 8A and 8B, the source electrode layer 506a or the drain electrode layer 506b are provided to be in contact with mainly side surfaces of the oxide semiconductor layer 504. Therefore, an electric field applied from the gate electrode layer 510 to the oxide semiconductor layer 504 is less likely to be prevented by the source electrode layer 506a and the drain electrode layer 506b. Thus, the current path in the oxide semiconductor layer can be wider than that in the transistors illustrated in FIGS. 4A and 4B, and FIGS. 7A and 7B, and a higher on-state current can be obtained.

Furthermore, since the level of the top surface of the oxide semiconductor layer 504, that of the insulating layer 518a, and that of the insulating layer 518b are the same, shape defects do not easily occur. Therefore, a semiconductor device including the transistor can be manufactured with high yield.

Note that for the insulating layer 518a and the insulating layer 518b, the description of the base insulating layer 402 is referred to.

For the substrate 500, the description of the substrate 400 is referred to. For the base insulating layer 502, the description of the base insulating layer 402 is referred to. For the oxide semiconductor layer 504, the description of the oxide semiconductor layer 404 is referred to. For the source electrode layer 506a and the drain electrode layer 506b, the description of the source electrode layer 406a and the drain electrode layer 406b is referred to. For the gate insulating layer 508a, the description of the gate insulating layer 408a is referred to. For the gate insulating layer 508b, the description of the gate insulating layer 408b is referred to. For the gate electrode layer 510, the description of the gate electrode layer 410 is referred to. For the insulating layer 512, the description of the insulating layer 412 is referred to.

<Modification Example of Transistor Structure 2>

As in the transistor illustrated in FIGS. 8A and 8B, an oxide layer may be provided under the gate insulating layer 508a. For the oxide layer, the description of the oxide layer 409 is referred to. Note that the description of the transistor illustrated in FIGS. 8A and 8B is referred to for the structures of the other components.

<Transistor Structure 3>

Figure 9A:
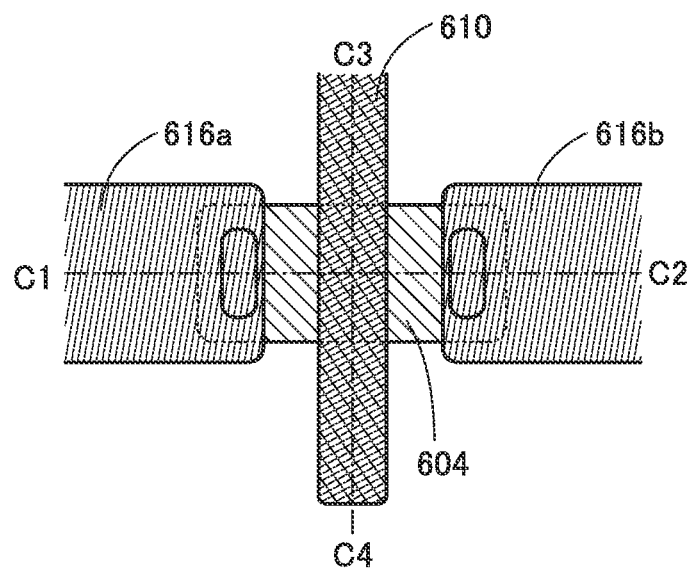
FIGS. 9A and 9B are a top view and a cross-sectional view illustrating a transistor of one embodiment of the present invention.
Figure 9B:
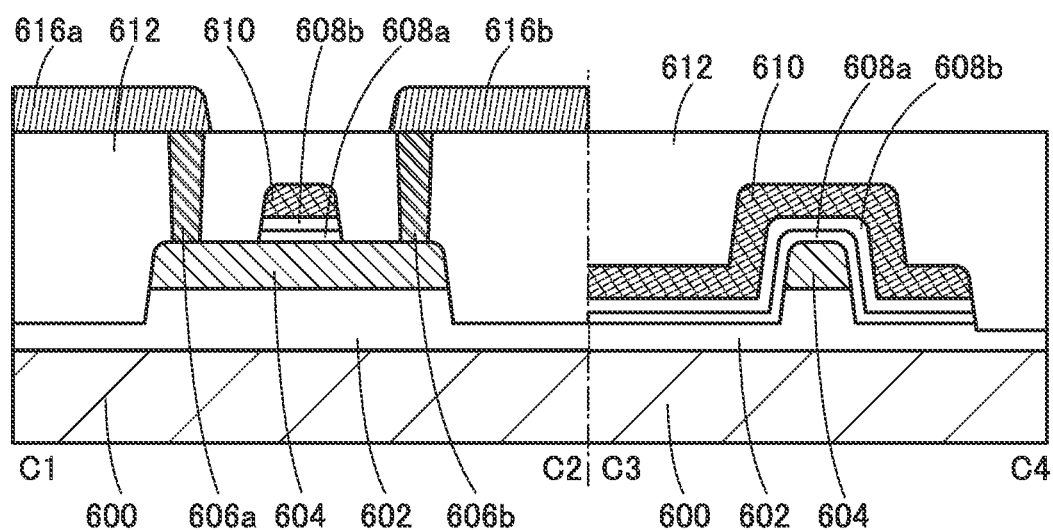

FIGS. 9A and 9B are a top view and a cross-sectional view of a transistor of one embodiment of the present invention. FIG. 9A is a top view and FIG. 9B is a cross-sectional view taken along dashed-dotted line C1-C2 and dashed-dotted line C3-C4 in FIG. 9A. Note that for simplification of the drawing, some components in the top view in FIG. 9A are not illustrated.

The transistor illustrated in FIGS. 9A and 9B includes a base insulating layer 602 having a projecting portion over a substrate 600, an oxide semiconductor layer 604 over the projecting portion of the base insulating layer 602, a gate insulating layer 608a over the oxide semiconductor layer 604, a gate insulating layer 608b over the gate insulating layer 608a, a gate electrode layer 610 which is in contact with a top surface of the gate insulating layer 608b and faces a top surface and side surfaces of the oxide semiconductor layer 604, an insulating layer 612 which is over the oxide semiconductor layer 604 and the gate electrode layer 610 and includes openings reaching the oxide semiconductor layer 604, a source electrode layer 606a and a drain electrode layer 606b which fill the openings, and a wiring layer 616a and a wiring layer 616b in contact with the source electrode layer 606a and the drain electrode layer 606b, respectively. Note that the base insulating layer 602 does not necessarily include a projecting portion.

In the transistor illustrated in FIGS. 9A and 9B, the description of the gate insulating layer 108b in Embodiment 1 can be referred to for the gate insulating layer 608b. Note that the gate insulating layer 608b may be either a single layer or a stacked layer. The description of the gate insulating layer 108a in Embodiment 1 can be referred to for the gate insulating layer 608a. Note that the gate insulating layer 608a may be either a single layer or a stacked layer.

In the transistor illustrated in FIGS. 9A and 9B, the gate insulating layer 608b includes negative fixed charges or trap centers, and the negative fixed charges or the trap centers are apart from the oxide semiconductor layer 604 with the use of the gate insulating layer 608a. Thus, by performing charge trapping treatment on the transistor, the transistor in which the threshold voltage is shifted in the positive direction and the shift after that is suppressed and which has stable electrical characteristics can be provided.

Although FIGS. 9A and 9B show an example of a transistor having a stacked-layer structure of the gate insulating layer 608a and the gate insulating layer 608b, this embodiment is not limited thereto. An insulating layer corresponding to the gate insulating layer 108d in Embodiment 1 may be provided between the gate insulating layer 608a and the oxide semiconductor layer 604, or an insulating layer corresponding to the gate insulating layer 108c in Embodiment 1 may be provided between the gate insulating layer 608b and the gate electrode layer 610.

In the transistor in FIGS. 9A and 9B, the source electrode layer 606a and the drain electrode layer 606b are provided so as not to overlap with the gate electrode layer 610. Thus, parasitic capacitance generated between the gate electrode layer 610 and the source electrode layer 606a or the drain electrode layer 606b can be reduced. For this reason, the transistor in FIGS. 9A and 9B can have excellent switching characteristics.

Since the level of the top surface of the insulating layer 612, that of the source electrode layer 606a, and that of the drain electrode layer 606b are the same, shape defects do not easily occur. Therefore, a semiconductor device including the transistor can be manufactured with high yield.

Note that for the wiring layer 616a and the wiring layer 616b, the description of the gate electrode layer 410 is referred to.

For the substrate 600, the description of the substrate 400 is referred to. For the base insulating layer 602, the description of the base insulating layer 402 is referred to. For the oxide semiconductor layer 604, the description of the oxide semiconductor layer 404 is referred to. For the source electrode layer 606a and the drain electrode layer 606b, the description of the source electrode layer 406a and the drain electrode layer 406b is referred to. For the gate insulating layer 608a, the description of the gate insulating layer 408a is referred to. For the gate insulating layer 608b, the description of the gate insulating layer 408b is referred to. For the gate electrode layer 610, the description of the gate electrode layer 410 is referred to. For the insulating layer 612, the description of the insulating layer 412 is referred to.

<Modification Example of Transistor Structure 3>

As in the transistor illustrated in FIGS. 9A and 9B, an oxide layer may be provided under the gate insulating layer 608a. For the oxide layer, the description of the oxide layer 409 is referred to. Note that the description of the transistor illustrated in FIGS. 9A and 9B is referred to for the structures of the other components.

The structures, methods, and the like described in this embodiment can be combined as appropriate with any of the structures, methods, and the like described in the other embodiments.

Embodiment 4

In this embodiment, a stacked-layer structure included in a semiconductor device of one embodiment of the present invention will be described with reference to FIGS. 17A1, 17A2, and 17B and FIGS. 18A1, 18A2, and 18B.

A technical idea of one embodiment of the present invention is that in a transistor in which a channel is formed in an oxide semiconductor, a gate insulating layer overlapping with an oxide semiconductor layer includes a predetermined number of negative fixed charges and/or charge trap states (trap centers) trapping negative charges. As the gate insulating layer of the transistor, an insulating layer including a predetermined number of negative fixed charges is used; thus, even when voltage is not applied to a gate electrode layer, a negative electric field is always applied to a channel formation region. In other words, voltage applied to the gate is necessarily increased to form the channel; accordingly, the threshold voltage of the transistor can be shifted in the positive direction. Furthermore, the transistor of one embodiment of the present invention has a structure in which negative fixed charges included in the gate insulating layer and/or charge trap states trapping negative charges exist to be apart from the gate electrode layer. Thus, the negative charges trapped in the charge trap states can be prevented from being released (injected) to the gate electrode layer.

<Stacked-Layer Structure 1 Included in Semiconductor Device>

FIGS. 17A1 and 17A2 are other structure examples of the conceptual diagrams of the stacked-layer structure included in the semiconductor device of one embodiment of the present invention.

FIG. 17A1 illustrates a semiconductor device including the oxide semiconductor layer 104, the gate insulating layer 108 provided over the oxide semiconductor layer 104 and including the charge trap states 107, and the gate electrode layer 110 overlapping with the oxide semiconductor layer 104 with the gate insulating layer 108 provided therebetween. The charge trap states 107 included in the gate insulating layer 108 exist to be apart from the gate electrode layer 110. After the stacked-layer structure illustrated in FIG. 17A1, at a temperature higher than the operating temperature or the storage temperature of the semiconductor device, or higher than or equal to 125° C. and lower than or equal to 450° C., typically, higher than or equal to 150° C. and lower than or equal to 300° C. the potential of the gate electrode layer 110 is kept higher than the potentials of a source and a drain (not illustrated) for one second or more, typically, one minute more; thus, charges are trapped in the charge trap states 107 included in the gate insulating layer 108.

FIG. 17A2 is a conceptual diagram illustrating the structure of the semiconductor device after treatment in which charges are trapped in the charge trap states 107 (hereinafter also referred to as charge trapping treatment) is performed on the semiconductor device illustrated in FIG. 17A1, and the semiconductor device includes negative charges 109 in which electrons are trapped in some or all of the charge trap states 107 included in the gate insulating layer 108. The number of the negative charges 109 included in the gate insulating layer 108 can be controlled by the potential of the gate electrode layer 110 in the charge trapping treatment. The total number of electrons trapped in the charge trap states 107 (i.e., the total number of the negative charges 109 in FIG. 17A2) is increased linearly at the beginning of the charge trapping treatment, and the rate of increase gradually decreases and then converges on a certain value. The convergence value depends on the potential of the gate electrode layer 110. As the potential is higher, the number of trapped electrons is more likely to be large; however, it never exceeds the total number of the charge trap states 107.

When the gate insulating layer 108 includes negative charges, the threshold voltage of the semiconductor device is shifted in the positive direction. Furthermore, when the negative charges included in the gate insulating layer 108 are fixed charges, further shift of the threshold voltage is suppressed, and the semiconductor device can have stable electrical characteristics. For these reasons, in the semiconductor device in FIG. 17A2, the negative charges 109 trapped in the charge trap states required to become negative fixed charges which are stable in the gate insulating layer 108 and not to be released from the gate insulating layer 108.

In the structure illustrated in FIG. 17A2, the negative charges 109 included in the gate insulating layer 108 exist to be apart from an interface of the gate electrode layer 110; thus, release of the negative charges 109 to the gate electrode layer 110 can be suppressed. Therefore, the gate insulating layer 108 which includes stable negative fixed charges and in which release of charges is suppressed can be formed. By providing such a gate insulating layer 108 including the stable negative charges 109 (in other words, negative fixed charges), it is possible to provide a semiconductor device having stable electrical characteristics in which a shift of the threshold voltage after the charge trapping treatment, i.e., after a predetermined number of charges are held by the gate insulating layer 108, is suppressed.

In addition, it is also effective for fixing negative charges that the effective mass of a hole is extremely large in an oxide semiconductor. This is because the injection of holes from the oxide semiconductor layer 104 which is in contact with a bottom of the gate insulating layer 108 to the gate insulating layer 108 does not occur and consequently a phenomenon in which the negative charges 109 combine with holes and disappear substantially cannot occur; thus, the negative charges 109 included in the gate insulating layer 108 can be stabilized.

Note that the amount of shift in the threshold voltage can be controlled by the total number of the negative charges 109 included in the gate insulating layer 108. It is preferable that in an n-channel transistor including the oxide semiconductor layer 104, the gate insulating layer 108 include the negative charges 109 to such a degree that it has positive threshold voltage and be controlled to be normally off.

<Structure Example 1 of Gate Insulating Layer>

FIG. 17B illustrates a specific structure example of the semiconductor device having the structure illustrated in FIG. 17A2. The semiconductor device illustrated in FIG. 17B includes the oxide semiconductor layer 104, the gate insulating layer 108 which includes a first region 118a and a second region 118b and is over the oxide semiconductor layer 104, and the gate electrode layer 110 over the gate insulating layer 108. In the gate insulating layer 108, the first region 118a includes the negative charges 109. In other words, the gate insulating layer 108 (particularly, the first region 118a in the gate insulating layer 108) is a negatively charged insulating layer. In the gate insulating layer 108, the second region 118b between the first region 118a and the gate electrode layer 110 has density of negative charges 109 lower than that of the first region 118a. The second region 118b has a function of making the first region 118a including the negative charges 109 and the gate electrode layer 110 apart from each other.

For the gate insulating layer 108, a material and/or a formation method are/is selected so that the gate insulating layer 108 includes charge trap states. For example, as the gate insulating layer 108, an insulating layer formed using an oxide (including a composite oxide) containing one or more elements selected from hafnium, aluminum, tantalum, zirconium, and the like can be used. It is preferable to use an insulating layer formed using hafnium oxide, an insulating layer formed using aluminum oxide, an insulating layer formed using hafnium silicate, or an insulating layer formed using aluminum silicate. A high dielectric constant (high-k) material such as hafnium oxide is preferably used for a gate insulating layer because the thickness of the gate insulating layer can be increased to prevent gate leakage and at the same time electrical characteristics can be maintained. In this embodiment, an insulating layer formed using hafnium oxide is formed as the gate insulating layer 108. It is possible to employ a sputtering method or an atomic layer deposition (ALD) method as a method for forming the gate insulating layer 108. The gate insulating layer 108 just after the formation has charge trap states in the entire layer in the thickness direction.

The film formation temperature of the gate insulating layer 108 is preferably 100° C. or higher, more preferably 150° C. or higher. By forming the gate insulating layer 108 in the above temperature range, attachment of hydrogen or a hydrogen compound (e.g., adsorbed water) to the oxide semiconductor layer 104 which is below the gate insulating layer 108 can be prevented, and entry of hydrogen or a hydrogen compound into the oxide semiconductor layer 104 can be decreased. Hydrogen partly serves as donors by bonding to an oxide semiconductor and causes generation of electrons serving as carriers, whereby the threshold voltage of the transistor is shifted (changed) in the negative direction. Therefore, the gate insulating layer 108 is formed while entry of hydrogen or a hydrogen compound into the oxide semiconductor layer 104 is decreased; thus, electrical characteristics of the transistor can be stabilized.

The gate electrode layer 110 over the gate insulating layer 108 includes a metal nitride film having conductivity at least in a region in contact with the gate insulating layer 108. The gate electrode layer 110 may have a single-layer structure or a stacked-layer structure. As the metal nitride film having conductivity, a tantalum nitride film or a titanium nitride film can be used for example. In this embodiment, the gate electrode layer 110 has a stacked-layer structure of the gate electrode layer 110a formed using a metal nitride film having conductivity and the gate electrode layer 110b formed using another metal material. By providing a metal nitride film in contact with the gate insulating layer 108, nitrogen contained in the metal nitride film is diffused into the second region 118b placed in the vicinity of a surface of the gate insulating layer 108 through a formation step of the metal nitride film and/or the following heat treatment step. Since nitrogen has a function of making charge trap states included in an insulating layer formed using an oxide (including a composite oxide) containing one or more elements selected from hafnium, aluminum, tantalum, zirconium, and the like disappear, when the second region 118b includes nitrogen, the second region 118b can be a region with reduced charge trap states.

It is preferable that the gate electrode layer 110a which is a metal nitride film be formed by a sputtering method. When the gate electrode layer 110a is formed by a sputtering method, sputtering is performed on the vicinity of the surface of the gate insulating layer 108 over which a film is formed at the same time, which enables formation of the second region 118b into which nitrogen is effectively introduced. Note that the thicknesses of the first region 118a and the second region 118b can be controlled using the depth of a region to which nitrogen is introduced.

In the case where the first region 118a and the second region 118b are formed by adding nitrogen to part of the gate insulating layer 108, the interface therebetween might not be clear. In FIG. 18B, the interface between the first region 118a and the second region 118b is schematically denoted by a dotted line. Furthermore, the concentration of nitrogen included in the second region 118b might be gradient in the thickness direction. Typically, the concentration of nitrogen is the highest at the surface of the gate insulating layer 108, and decreases toward the oxide semiconductor layer 104 side.

Furthermore, depending on the material and/or formation method of the gate electrode layer 110, negative fixed charges might be included in the second region 118b; however, the total number thereof is significantly reduced as compared with the first region 118a. Therefore, it can be said that the negative charges 109 included in the gate insulating layer 108 are relatively apart from the gate electrode layer 110.

In the semiconductor device illustrated in FIG. 18B, the negative charges 109 included in the gate insulating layer 108 are apart from the gate electrode layer 110 with the use of the second region 118b including nitrogen. Thus, release of the negative charges 109 to the gate electrode layer 110 can be suppressed. Consequently, the gate insulating layer 108 including the stable negative charges 109 the release of which is suppressed, i.e., negative fixed charges, can be formed.

<Stacked-Layer Structure 2 Included in Semiconductor Device>

FIGS. 18A1 and 18A2 are other structure examples of the conceptual diagrams of the stacked-layer structure included in the semiconductor device of one embodiment of the present invention.

The semiconductor device illustrated in FIG. 18A1 is different from that in FIG. 17A1 in that the charge trap states 107 in the gate insulating layer 108 are apart from both the oxide semiconductor layer 104 and the gate electrode layer 110, and the other components are the same as those in FIG. 17A1. FIG. 18A2 is a conceptual diagram illustrating the structure of the semiconductor device illustrated in FIG. 18A1 after charge trapping treatment and is the same as that in FIG. 17A2 except that the negative charges 109 are apart from both the oxide semiconductor layer 104 and the gate electrode layer 110.

As described above, the following is required: the negative charges 109 trapped in the charge trap states are stably fixed in the gate insulating layer 108 and are not released from the gate insulating layer 108. Since the negative charges 109 included in the gate insulating layer 108 are apart from both interfaces of the oxide semiconductor layer 104 and the gate electrode layer 110 in the structure illustrated in FIG. 18A2, release of the negative charges 109 to the oxide semiconductor layer 104 and the gate electrode layer 110 is suppressed. Consequently, the threshold voltage of the semiconductor device can be fixed more stably.

<Structure Example 2 of Gate Insulating Layer>

FIG. 18B illustrates a structure example of the semiconductor device having the structure illustrated in FIG. 18A2. The semiconductor device illustrated in FIG. 18B includes, in this order from the side in contact with the oxide semiconductor layer 104, the gate insulating layer 105 and the gate insulating layer 108 including the first region 118a and the second region 118b, and is different from the semiconductor device illustrated in FIG. 17B in that the gate insulating layer 105 is included between the gate insulating layer 108 and the oxide semiconductor layer 104. The other components are the same as those of the semiconductor device in FIG. 17B; thus, detailed description is omitted.

In the semiconductor device illustrated in FIG. 18B, the gate insulating layer 105 in contact with the oxide semiconductor layer 104 preferably contains constituent elements different from those of the gate insulating layer 108. For example, an insulating layer containing silicon oxide or silicon oxynitride can be used as the gate insulating layer 105. In an insulating layer containing silicon oxide or silicon oxynitride, charge trap states are less likely to be formed than in the above insulating layer formed using an oxide (including a composite oxide) containing one or more elements selected from hafnium, aluminum, tantalum, zirconium, and the like. Thus, by providing the gate insulating layer 105 between the oxide semiconductor layer 104 and the gate insulating layer 108, the negative charges 109 included in the gate insulating layer 108 can be more surely apart from the oxide semiconductor layer 104.

Note that the gate insulating layer 105 is preferably formed by a CVD method. A film with a preferable film quality can be easily formed by a CVD method as compared with a sputtering method, and charge trap states are less likely to be formed in an insulating layer formed by a CVD method. Accordingly, by forming the gate insulating layer 105 by a CVD method, the amount of leakage current between a gate and a drain or between a gate and a source can be reduced in the transistor.

Since the negative charges 109 included in the gate insulating layer 108 are apart from both interfaces of the oxide semiconductor layer 104 and the gate electrode layer 110 in the semiconductor device illustrated in FIG. 18B, release of the negative charges 109 to the oxide semiconductor layer 104 and the gate electrode layer 110 is suppressed. Consequently, the threshold voltage of the semiconductor device can be fixed more stably.

As described above, the semiconductor device in this embodiment includes a predetermined number of negative fixed charges in the gate insulating layer 108, and the negative fixed charges are apart from at least the gate electrode layer 110; thus, the threshold voltage can be shifted in the positive direction and the shift after that can be suppressed. In other words, the structure described in this embodiment enables formation of a semiconductor device having a threshold voltage which is fixed to a positive value.

Note that charge trapping treatment may be performed during a process of manufacturing the semiconductor device, or in a period after manufacture of the semiconductor device and before shipment. For example, the treatment is preferably performed at any step before factory shipment, such as after formation of a wire metal connected to the source electrode or the drain electrode of the semiconductor device, after pretreatment (wafer processing), after a wafer-dicing step, or after packaging. In any case, it is preferable that the semiconductor device be not exposed to environment at temperatures higher than or equal to 125° C. for one hour or more after the step.

The structures, methods, and the like described in this embodiment can be combined as appropriate with any of the structures, methods, and the like described in the other embodiments.

Embodiment 5

Figure 19A:
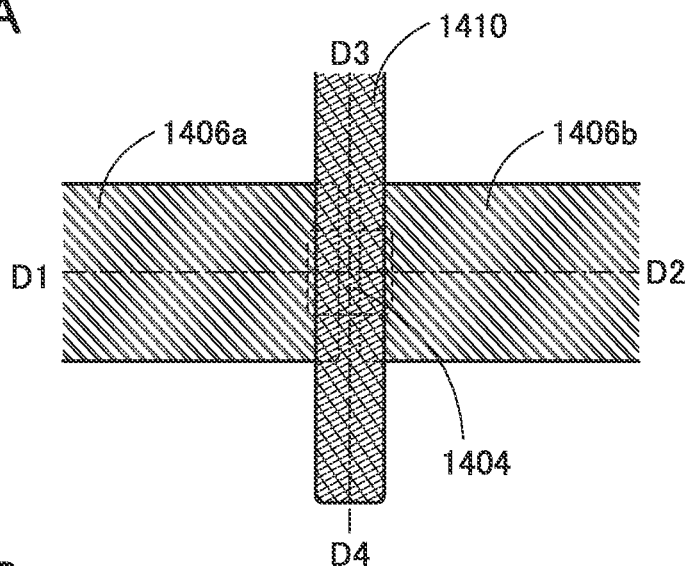
FIGS. 19A to 19C are a top view and cross-sectional views which illustrate a transistor of one embodiment of the present invention.
Figure 19B:
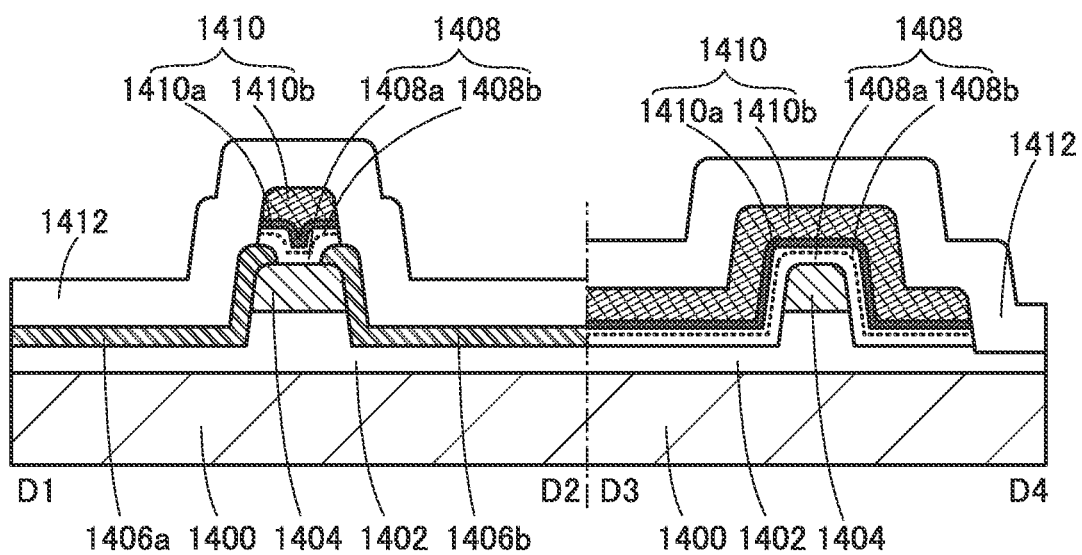
Figure 19C:
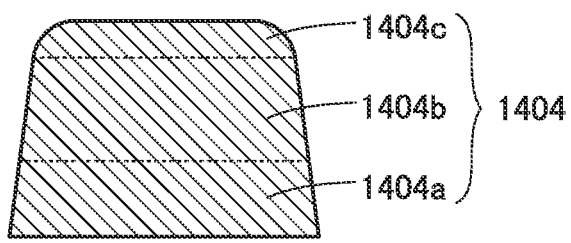

In this embodiment, a semiconductor device of one embodiment of the present invention having the stacked-layer structure described in Embodiment 4 will be described with reference to drawings.
<Transistor Structure 4>
FIGS. 19A and 19B are a top view and a cross-sectional view of a transistor of one embodiment of the present invention. FIG. 19A is a top view and FIG. 19B is a cross-sectional view taken along dashed-dotted line D1-D2 and dashed-dotted line D3-D4 in FIG. 19A. Note that for simplification of the drawing, some components in the top view in FIG. 19A are not illustrated.

The transistor illustrated in FIGS. 19A and 19B includes a base insulating layer 1402 having a projecting portion over a substrate 1400, an oxide semiconductor layer 1404 over the projecting portion of the base insulating layer 1402, a source electrode layer 1406*a* and a drain electrode layer 1406*b* in contact with a top surface and side surfaces of the oxide semiconductor layer 1404, a gate insulating layer 1408 including a first region 1408*a* and a second region 1408*b* over the oxide semiconductor layer 1404, the source electrode layer 1406*a*, and the drain electrode layer 1406*b*, a gate electrode layer 1410 having a stacked-layer structure of a gate electrode layer 1410*a* and a gate electrode layer 1410*b* which are in contact with a top surface of the gate insulating layer 1408 and face a top surface and side surfaces of the oxide semiconductor layer 1404, and an insulating layer 1412 over the source electrode layer 1406*a*, the drain electrode layer 1406*b*, and the gate electrode layer 1410. Note that the base insulating layer 1402 does not necessarily include a projecting portion.

In the transistor illustrated in FIGS. 19A and 19B, the gate insulating layer 1408 is an insulating layer which is formed by selecting a material and/or a formation method to include charge trap states and which includes negative fixed charges and/or charge trap states (trap centers) trapping negative charges. For the details thereof, the description of the gate insulating layer 108 in Embodiment 4 can be referred to. Furthermore, the first region 1408*a* included in the gate insulating layer 1408 is a region including negative fixed charges at higher density than that of the second region 1408*b*, and for the description thereof, the description of the first region 118*a* in Embodiment 4 can be referred to. The second region 1408*b* included in the gate insulating layer 1408 is a region having a reduced density of charge trap states by including nitrogen, and has a function of making the negative fixed charges included in the first region 1408*a* apart from the gate electrode layer 1410. For the details thereof, the description of the second region 118*b* in Embodiment 4 can be referred to. Note that the gate insulating layer 1408 may be either a single layer or a stacked layer.

In the transistor illustrated in FIGS. 19A and 19B, a metal nitride film having conductivity can be used as the gate electrode layer 1410*a*. For the details thereof, the description of the gate electrode layer 110*a* in Embodiment 4 can be referred to. Furthermore, the gate electrode layer 1410*b* corresponds to the gate electrode layer 110*b* in Embodiment 4, and for the details thereof, the description of the gate electrode layer 110*b* can be referred to.

In the transistor illustrated in FIGS. 19A and 19B, the gate insulating layer 1408 includes negative fixed charges or trap centers, and the negative fixed charges or the trap centers are apart from the gate electrode layer 1410 with the use of the second region 1408*b* including nitrogen. Thus, by performing charge trapping treatment on the transistor, the transistor in which the threshold voltage is shifted in the positive direction and the shift after that is suppressed and which has stable electrical characteristics can be provided.

Although FIGS. 19A and 19B illustrates the transistor including the gate insulating layer 1408 having the first region 1408*a* and the second region 1408*b* as an example, this embodiment is not limited thereto, and an insulating layer corresponding to the gate insulating layer 105 in Embodiment 4 may be provided between the gate insulating layer 1408 (specifically, the first region 1408*a*) and the oxide semiconductor layer 1404.

The substrate 1400 is not limited to a simple support, and may be a substrate where an element such as a transistor or a capacitor is formed. In that case, at least one of the gate electrode layer 1410, the source electrode layer 1406*a*, and the drain electrode layer 1406*b* of the transistor may be electrically connected to the above element.

The base insulating layer 1402 can have a function of supplying oxygen to the oxide semiconductor layer 1404 as well as a function of preventing diffusion of impurities from the substrate 1400. Thus, the base insulating layer 1402 is preferably an insulating layer containing oxygen. For example, an insulating layer containing oxygen more than that in the stoichiometric composition is more preferable. Note that in the case where the substrate 1400 is a substrate where an element is formed as described above, the base insulating layer 1402 has also a function as an interlayer insulating layer. In that case, a surface of the base insulating layer 1402 may be planarized. For example, the base insulating layer 1402 may be subjected to planarization treatment such as CMP treatment.

For the oxide semiconductor layer 1404, the description of the oxide semiconductor layer 404 can be referred to.

As the source electrode layer 1406*a* and the drain electrode layer 1406*b* illustrated in FIGS. 19A and 19B, a conductive layer capable of extracting oxygen from the oxide semiconductor layer is preferably used. As an example of the conductive layer capable of extracting oxygen from the oxide semiconductor layer, a conductive layer containing aluminum, titanium, chromium, nickel, molybdenum, tantalum, tungsten, or the like can be given.

The gate electrode layer 1410 may be formed using a conductive layer containing one or more of aluminum, titanium, chromium, cobalt, nickel, copper, yttrium, zirconium, molybdenum, ruthenium, silver, tantalum, tungsten, and the like.

The insulating layer 1412 can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

The transistor illustrated in FIGS. 19A and 19B is a transistor whose threshold voltage is controlled by the gate insulating layer 1408 including the negative fixed charges. A normally-off transistor whose threshold voltage is fixed to a positive value is preferable.

Next, a method for manufacturing the transistor is described with reference to FIGS. 20A to 20C and FIGS. 21A to 21C.

Figure 20A:
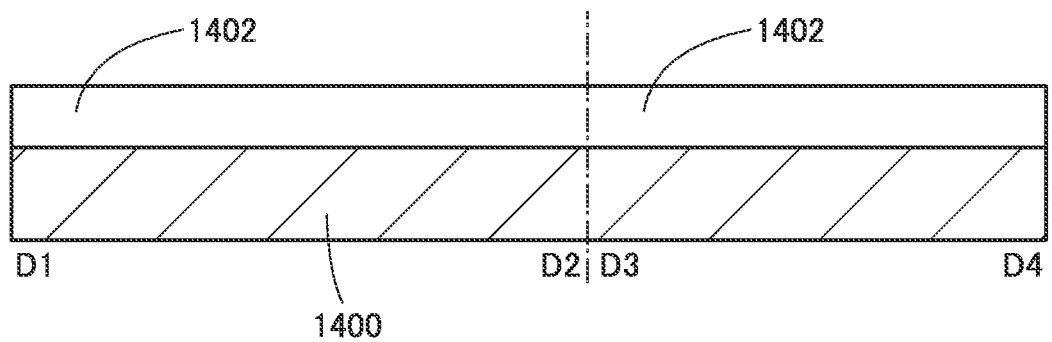
FIGS. 20A to 20C are cross-sectional views illustrating a method for manufacturing a transistor of one embodiment of the present invention.

First, the base insulating layer 1402 is formed over the substrate 1400 (see FIG. 20A).

For a method for forming the base insulating layer 1402, the description of the method for forming the base insulating layer 402 is referred to.

Figure 20B:
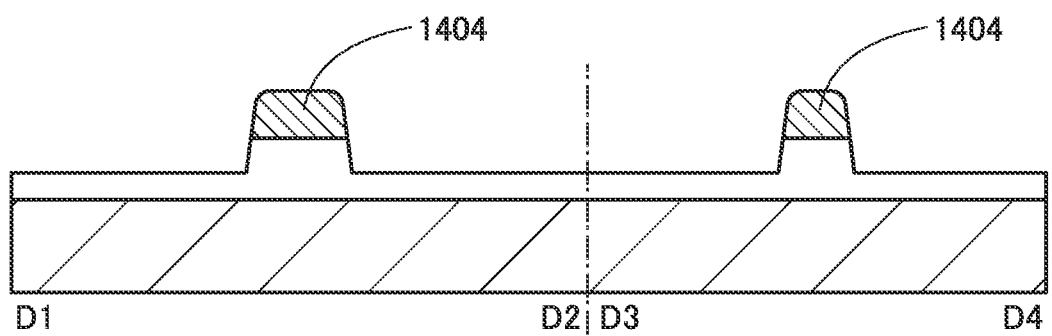

Next, the oxide semiconductor layer 1404 is formed over the base insulating layer 1402 (see FIG. 20B). For a method for forming the oxide semiconductor layer 1404, the method for forming the oxide semiconductor layer 404 is referred to. Furthermore, in the case where a stacked layer including the oxide semiconductor layer 1404*a*, the oxide semiconductor layer 1404*b*, and the oxide semiconductor layer 1404*c* is formed as the oxide semiconductor layer 1404, it is preferable that the layers be successively formed without exposure to the air.

In order to form an oxide semiconductor layer in which entry of impurities is reduced and which has high crystallinity, the oxide semiconductor layer 1404 is formed at a substrate temperature of higher than or equal to 100° C., preferably higher than or equal to 150° C., more preferably higher than or equal to 200° C. As an oxygen gas or an argon gas used as a deposition gas, a highly purified gas whose dew point is lower than or equal to −40° C., preferably lower than or equal to −80° C., more preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor layer 1404 is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 1404 can be improved, and in addition, impurities such as hydrogen and water can be removed from the base insulating layer 1402.

Figure 20C:
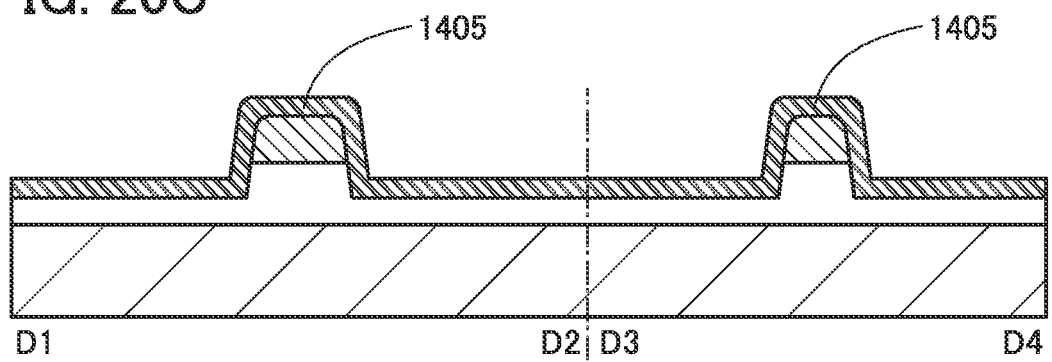

Next, a conductive layer 1405 to be the source electrode layer 1406*a* and the drain electrode layer 1406*b* is formed over the oxide semiconductor layer 1404 (see FIG. 20C). The conductive layer 1405 may be formed by a sputtering method, a CVD method, an MBE method, an ALD method, or a PLD method.

Figure 21A:
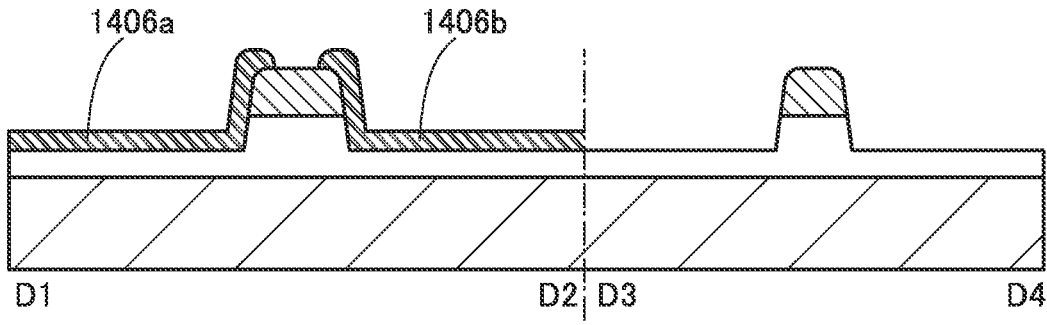
FIGS. 21A to 21C are cross-sectional views illustrating a method for manufacturing a transistor of one embodiment of the present invention.

Next, the conductive layer 1405 is divided by etching to form the source electrode layer 1406*a* and the drain electrode layer 1406*b* (see FIG. 21A). Note that when the conductive layer 1405 is etched, end portions of the source electrode layer 1406*a* and the drain electrode layer 1406*b* are rounded (curved) in some cases. Furthermore, when the conductive layer 1405 is etched, the base insulating layer 1402 may be etched appropriately.

Next, the gate insulating layer 1408 is formed over the oxide semiconductor layer 1404, the source electrode layer 1406*a*, and the drain electrode layer 1406*b*. The gate insulating layer 1408 may be formed by a sputtering method, a CVD method, or an ALD method. The gate insulating layer 1408 is an insulating layer formed using an oxide (including a composite oxide) containing one or more elements selected from hafnium, aluminum, tantalum, and the like.

Note that the gate insulating layer 1408 is preferably formed at a substrate temperature of higher than or equal to 100° C., preferably higher than or equal to 150° C. because entry of water can be reduced. Furthermore, heat treatment may be performed after the gate insulating layer 1408 is formed. The temperature of the heat treatment can be lower than 500° C., preferably lower than 400° C.

Figure 21B:
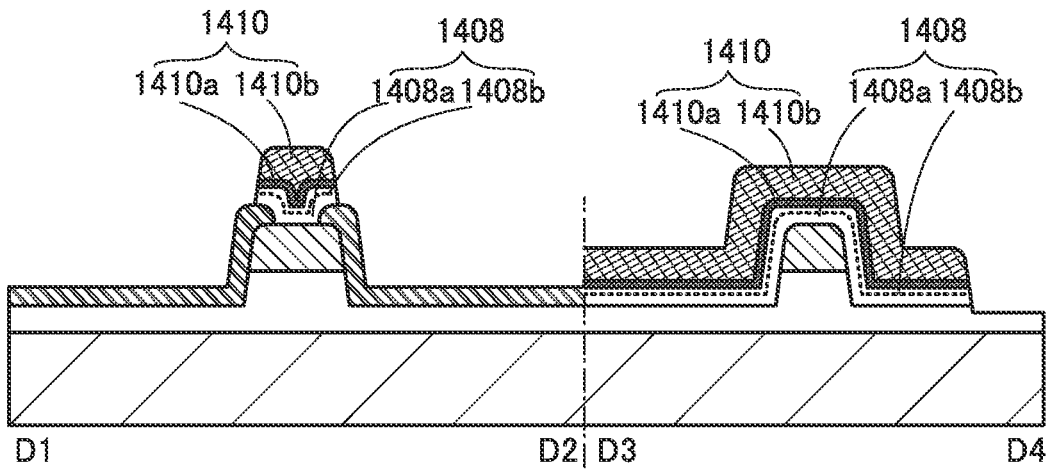

Next, the gate electrode layer 1410*a* and the gate electrode layer 1410*b* are formed over the gate insulating layer 1408 (see FIG. 21B). As the gate electrode layer 1410*a*, a metal nitride layer having conductivity is formed by a sputtering method. As the gate electrode layer 1410*a* over and in contact with the gate insulating layer 1408, a metal nitride film is used, in which case nitrogen can be added to the vicinity of a surface of the gate insulating layer 1408 (the vicinity of an interface with the gate electrode layer 1410*a*) by heat treatment at or after the formation of the metal nitride film. Thus, in the gate insulating layer 1408, the second region 1408b with a reduced density of charge trap states and the first region 1408a apart from the gate electrode layer 1410 can be formed.

Figure 21C:
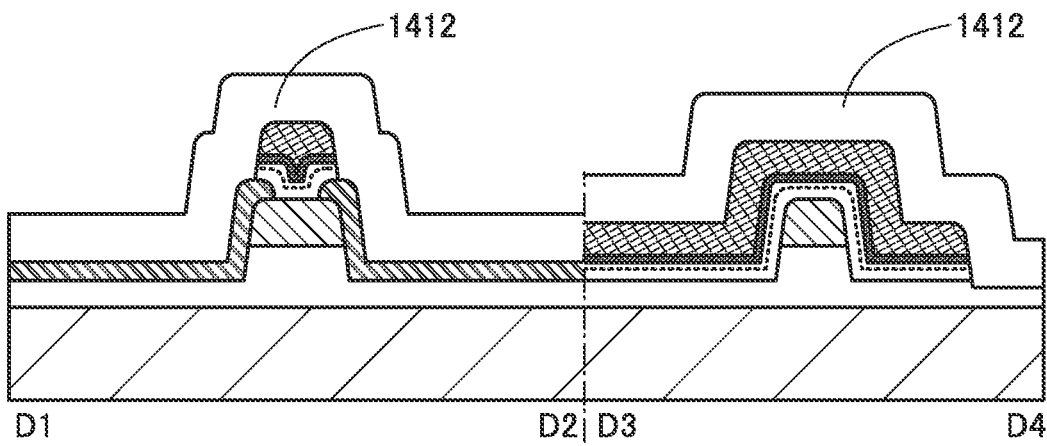

Next, the insulating layer 1412 is formed over the source electrode layer 1406a, the drain electrode layer 1406b, the gate insulating layer 1408, and the gate electrode layer 1410 (see FIG. 21C). The insulating layer 1412 may be formed by a sputtering method, a CVD method, an MBE method, an ALD method, or a PLD method.

Next, second heat treatment may be performed. The second heat treatment can be performed under conditions similar to those of the first heat treatment. The second heat treatment allows reducing oxygen vacancies in the oxide semiconductor layer 1404 in some cases.

Through the above steps, the transistor illustrated in FIGS. 19A and 19B can be manufactured.

<Modification Example of Transistor Structure 4>

Figure 22A:
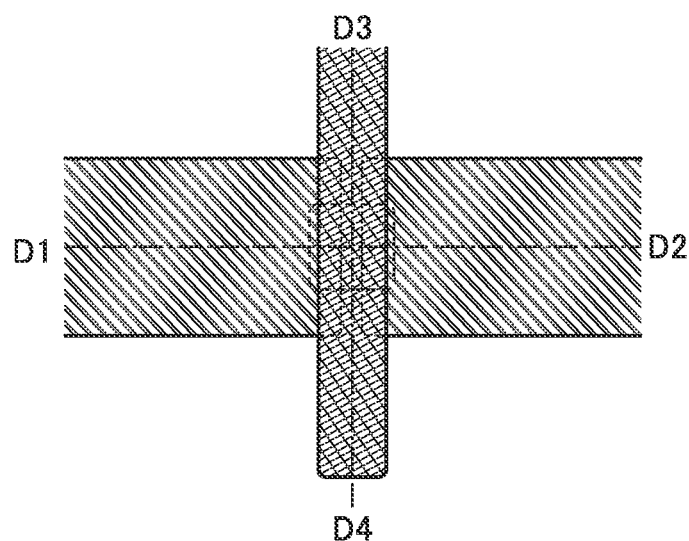
FIGS. 22A and 22B are a top view and a cross-sectional view which illustrate a transistor of one embodiment of the present invention.
Figure 22B:
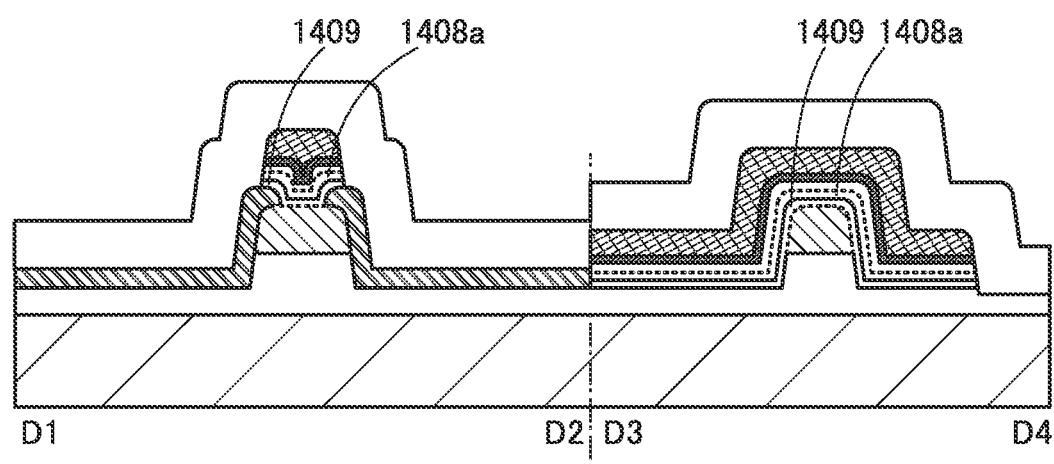

As in a transistor illustrated FIGS. 22A and 22B, an oxide layer 1409 may be provided under the gate insulating layer 1408. As the oxide layer 1409, the oxide semiconductor layer shown as the oxide semiconductor layer 1404c may be used. Note that the description of the transistor in FIGS. 19A and 19B can be referred to for the structures of the other components.

<Transistor Structure 5>

Figure 23A:
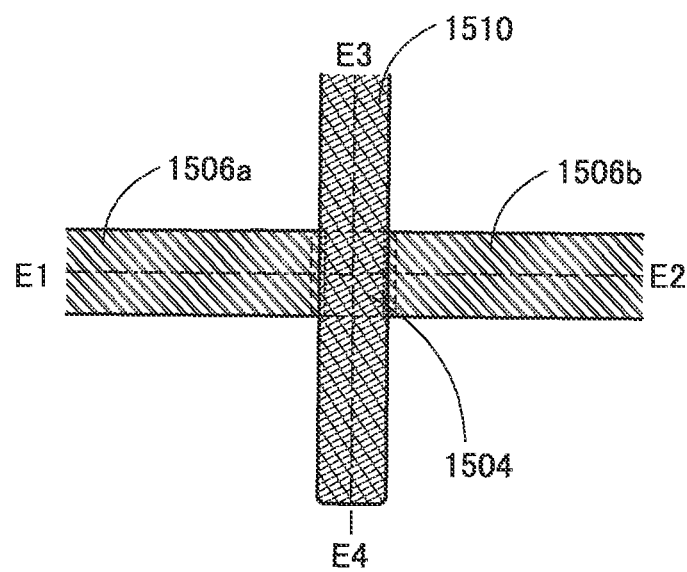
FIGS. 23A and 23B are a top view and a cross-sectional view which illustrate a transistor of one embodiment of the present invention.
Figure 23B:
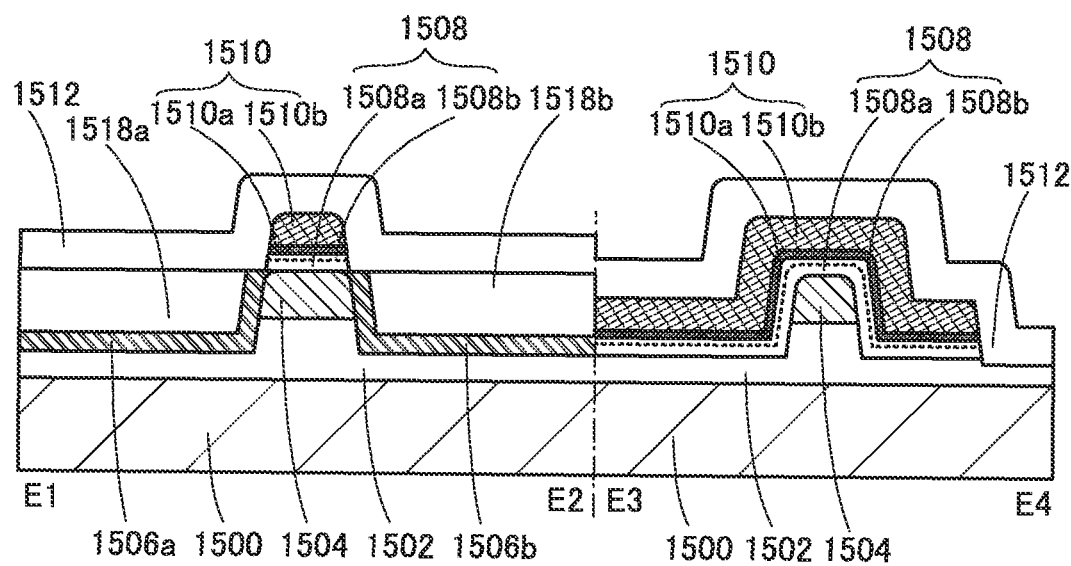

FIGS. 23A and 23B are a top view and a cross-sectional view of a transistor of one embodiment of the present invention. FIG. 23A is a top view and FIG. 23B is a cross-sectional view taken along dashed-dotted line E1-E2 and dashed-dotted line E3-E4 in FIG. 23A. Note that for simplification of the drawing, some components in the top view in FIG. 23A are not illustrated.

The transistor in FIGS. 23A and 23B includes a base insulating layer 1502 having a projecting portion over a substrate 1500, an oxide semiconductor layer 1504 over the projecting portion of the base insulating layer 1502, a source electrode layer 1506a and a drain electrode layer 1506b in contact with side surfaces of the oxide semiconductor layer 1504, an insulating layer 1518a and an insulating layer 1518b which are over the source electrode layer 1506a and the drain electrode layer 1506b and the levels of the top surfaces of which are the same as that of the oxide semiconductor layer 1504, a gate insulating layer 1508 including a first region 1508a and a second region 1508b over the oxide semiconductor layer 1504, the source electrode layer 1506a, and the drain electrode layer 1506b, a gate electrode layer 1510 including a gate electrode layer 1510a and a gate electrode layer 1510b which are in contact with a top surface of the gate insulating layer 1508 and face the top surface and the side surfaces of the oxide semiconductor layer 1504, and an insulating layer 1512 over the source electrode layer 1506a, the drain electrode layer 1506b, and the gate electrode layer 1510. Note that the base insulating layer 1502 does not necessarily include a projecting portion.

In the transistor illustrated in FIGS. 23A and 23B, the description of the gate insulating layer 108 in Embodiment 4 can be referred to for the gate insulating layer 1508. The description of the first region 118a in Embodiment 4 can be referred to for the first region 1508a included in the gate insulating layer 1508. The description of the second region 118b in Embodiment 4 can be referred to for the second region 1508b included in the gate insulating layer 1508. Note that the gate insulating layer 1508 may be either a single layer or a stacked layer.

In the transistor illustrated in FIGS. 23A and 23B, the description of the gate electrode layer 110a in Embodiment 4 can be referred to for the gate electrode layer 1510a. Furthermore, the gate electrode layer 1510b corresponds to the gate electrode layer 110b in Embodiment 4, and for the details thereof, the description of the gate electrode layer 110b can be referred to.

In the transistor illustrated in FIGS. 23A and 23B, the gate insulating layer 1508 includes negative fixed charges or trap centers, and the negative fixed charges or the trap centers are apart from the gate electrode layer 1510 with the use of the second region 1508b including nitrogen. Thus, by performing charge trapping treatment on the transistor, the transistor in which the threshold voltage is shifted in the positive direction and the shift after that is suppressed and which has stable electrical characteristics can be provided.

Although FIGS. 23A and 23B illustrates the transistor including the gate insulating layer 1508 having the first region 1508a and the second region 1508b as an example, this embodiment is not limited thereto, and an insulating layer corresponding to the gate insulating layer 105 in Embodiment 4 may be provided between the gate insulating layer 1508 (specifically, the first region 1508a) and the oxide semiconductor layer 1504.

In the transistor illustrated in FIGS. 23A and 23B, the source electrode layer 1506a or the drain electrode layer 1506b are provided to be in contact with mainly side surfaces of the oxide semiconductor layer 1504. Therefore, an electric field applied from the gate electrode layer 1510 to the oxide semiconductor layer 1504 is less likely to be prevented by the source electrode layer 1506a and the drain electrode layer 1506b. Thus, the current path in the oxide semiconductor layer can be wider than that in the transistors illustrated in FIGS. 19A and 19B, and FIGS. 22A and 22B, and a higher on-state current can be obtained.

Furthermore, since the level of the top surface of the oxide semiconductor layer 1504, that of the insulating layer 1518a, and that of the insulating layer 1518b are the same, shape defects do not easily occur. Therefore, a semiconductor device including the transistor can be manufactured with high yield.

Note that for the insulating layer 1518a and the insulating layer 1518b, the description of the base insulating layer 1402 can be referred to.

For the substrate 1500, the description of the substrate 1400 can be referred to. For the base insulating layer 1502, the description of the base insulating layer 1402 can be referred to. For the oxide semiconductor layer 1504, the description of the oxide semiconductor layer 1404 can be referred to. For the source electrode layer 1506a and the drain electrode layer 1506b, the description of the source electrode layer 1406a and the drain electrode layer 1406b can be referred to. For the insulating layer 1512, the description of the insulating layer 1412 can be referred to.

<Modification Example of Transistor Structure 5>

As in the transistor illustrated in FIGS. 23A and 23B, an oxide layer may be provided under the gate insulating layer 1508. For the oxide layer, the description of the oxide layer 1409 is referred to. Note that the description of the transistor illustrated in FIGS. 23A and 23B is referred to for the structures of the other components.

<Transistor Structure 6>

Figure 24A:
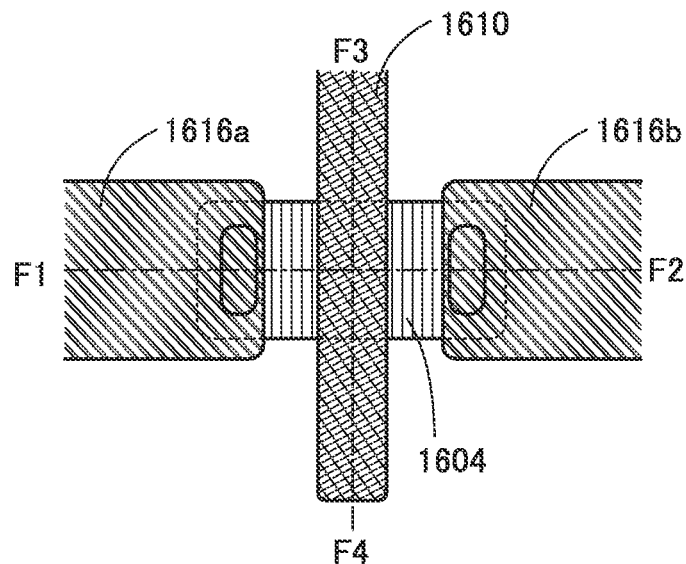
FIGS. 24A and 24B are a top view and a cross-sectional view which illustrate a transistor of one embodiment of the present invention.
Figure 24B:
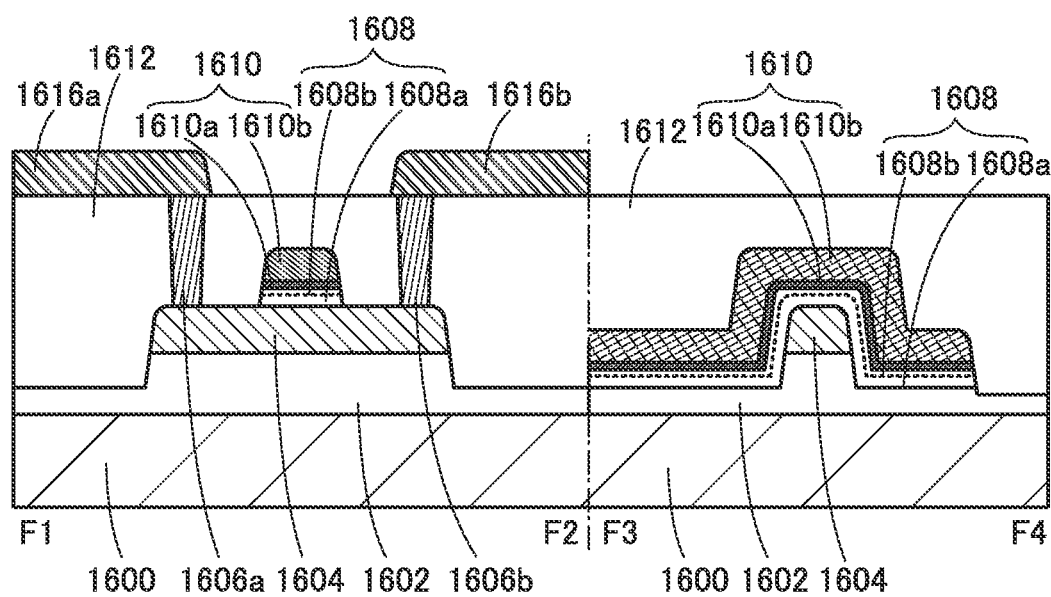

FIGS. 24A and 24B are a top view and a cross-sectional view of a transistor of one embodiment of the present invention. FIG. 24A is a top view and FIG. 24B is a cross-sectional view taken along dashed-dotted line F1-F2 and dashed-dotted line F3-F4 in FIG. 24A. Note that for simplification of the drawing, some components in the top view in FIG. 24A are not illustrated.

The transistor illustrated in FIGS. 24A and 24B includes a base insulating layer 1602 having a projecting portion over a substrate 1600, an oxide semiconductor layer 1604 over the projecting portion of the base insulating layer 1602, a gate insulating layer 1608 having a first region 1608a and a second region 1608b over the oxide semiconductor layer 1604, a gate electrode layer 1610 which includes a gate electrode layer 1610a and a gate electrode layer 1610b and is in contact with a top surface of the gate insulating layer 1608 and face a top surface and side surfaces of the oxide semiconductor layer 1604, an insulating layer 1612 which is over the oxide semiconductor layer 1604 and the gate electrode layer 1610 and includes openings reaching the oxide semiconductor layer 1604, a source electrode layer 1606a and a drain electrode layer 1606b which fill the openings, and a wiring layer 1616a and a wiring layer 1616b in contact with the source electrode layer 1606a and the drain electrode layer 1606b, respectively. Note that the base insulating layer 1602 does not necessarily include a projecting portion.

In the transistor illustrated in FIGS. 24A and 24B, the description of the gate insulating layer 108 in Embodiment 4 can be referred to for the gate insulating layer 1608. The description of the first region 118a in Embodiment 4 can be referred to for the first region 1608a included in the gate insulating layer 1608. The description of the second region 118b in Embodiment 4 can be referred to for the second region 1608b included in the gate insulating layer 1608. Note that the gate insulating layer 1608 may be either a single layer or a stacked layer.

In the transistor illustrated in FIGS. 24A and 24B, the description of the gate electrode layer 110a in Embodiment 4 can be referred to for the gate electrode layer 1610a. Furthermore, the gate electrode layer 1610b corresponds to the gate electrode layer 110b in Embodiment 4, and for the details thereof, the description of the gate electrode layer 110b can be referred to.

In the transistor illustrated in FIGS. 24A and 24B, the gate insulating layer 1608 includes negative fixed charges or trap centers, and the negative fixed charges or the trap centers are apart from the gate electrode layer 1610 with the use of the second region 1608b including nitrogen. Thus, by performing charge trapping treatment on the transistor, the transistor in which the threshold voltage is shifted in the positive direction and the shift after that is suppressed and which has stable electrical characteristics can be provided.

Although FIGS. 24A and 24B illustrates the transistor including the gate insulating layer 1608 having the first region 1608a and the second region 1608b as an example, this embodiment is not limited thereto, and an insulating layer corresponding to the gate insulating layer 105 in Embodiment 4 may be provided between the gate insulating layer 1608 (specifically, the first region 1608a) and the oxide semiconductor layer 1604.

In the transistor in FIGS. 24A and 24B, the source electrode layer 1606a and the drain electrode layer 1606b are provided so as not to overlap with the gate electrode layer 1610. Thus, parasitic capacitance generated between the gate electrode layer 1610 and the source electrode layer 1606a or the drain electrode layer 1606b can be reduced. For this reason, the transistor in FIGS. 24A and 24B can have excellent switching characteristics.

Since the level of the top surface of the insulating layer 1612, that of the source electrode layer 1606a, and that of the drain electrode layer 1606b are the same, shape defects do not easily occur. Therefore, a semiconductor device including the transistor can be manufactured with high yield.

Note that for the wiring layer 1616a and the wiring layer 1616b, the description of the gate electrode layer 1410 is referred to.

For the substrate 1600, the description of the substrate 1400 can be referred to. For the base insulating layer 1602, the description of the base insulating layer 1402 can be referred to. For the oxide semiconductor layer 1604, the description of the oxide semiconductor layer 1404 can be referred to. For the source electrode layer 1606a and the drain electrode layer 1606b, the description of the source electrode layer 1406a and the drain electrode layer 1406b can be referred to. For the insulating layer 1612, the description of the insulating layer 1412 can be referred to.

<Modification Example of Transistor Structure 6>

As in the transistor illustrated in FIGS. 24A and 24B, an oxide layer may be provided under the gate insulating layer 1608. For the oxide layer, the description of the oxide layer 1409 is referred to. Note that the description of the transistor illustrated in FIGS. 24A and 24B is referred to for the structures of the other components.

The structures, methods, and the like described in this embodiment can be combined as appropriate with any of the structures, methods, and the like described in the other embodiments.

Embodiment 6

In this embodiment, an example of a circuit including the transistor of one embodiment of the present invention is described with reference to drawings.

[Cross-Sectional Structure]

Figure 10A:
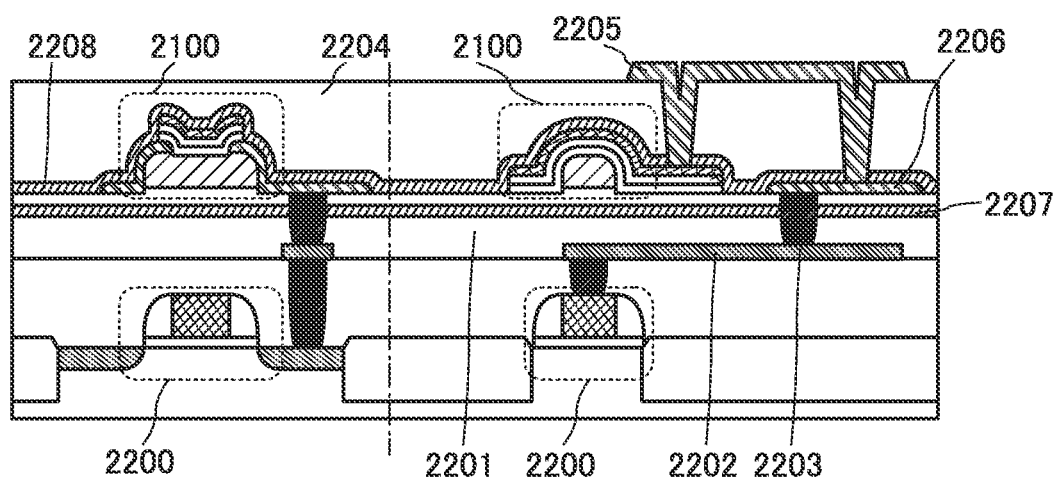
FIGS. 10A to 10C are a cross-sectional view and circuit diagrams of a semiconductor device of one embodiment.
Figure 10B:
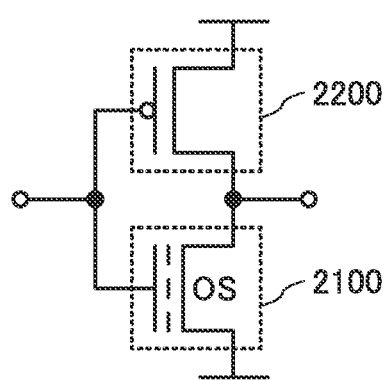
Figure 10C:
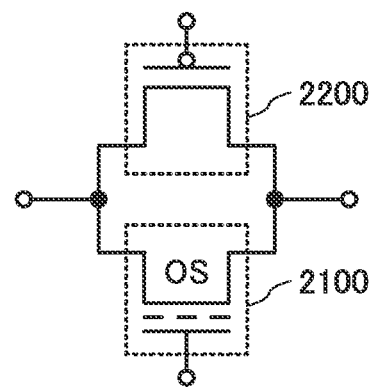

FIG. 10A is a cross-sectional view of a semiconductor device of one embodiment of the present invention. The semiconductor device illustrated in FIG. 10A includes a transistor 2200 containing a first semiconductor material in a lower portion and a transistor 2100 containing a second semiconductor material in an upper portion. In FIG. 10A, an example is described in which the transistor described in Embodiment 3 as an example is used as the transistor 2100 containing the second semiconductor material. Note that as illustrated in FIGS. 10B and 10C, a transistor symbol "OS" is written beside a transistor in which a channel is formed in an oxide semiconductor layer. A symbol different from that of a general transistor is written beside a transistor in which negative fixed charges are trapped in charge trap states in a gate insulating layer and thus the threshold voltage is changed. Specifically, a dashed line indicating negative fixed charges schematically is drawn in a portion corresponding to the gate insulating layer.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 10A illustrates a structure in which the transistor 2100 is provided over the transistor 2200 with an insulating layer 2201 and an insulating layer 2207 provided therebetween. A plurality of wirings 2202 are provided between the transistor 2200 and the transistor 2100. Furthermore, wirings and electrodes provided over and under the insulating layers are electrically connected to each other through a plurality of plugs 2203 embedded in the insulating layers. An insulating layer 2204 covering the transistor 2100, a wiring 2205 over the insulating layer 2204, and a wiring 2206 formed by processing a conductive layer that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating layer provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating layer 2207 having a function of preventing diffusion of hydrogen is provided between the transistors 2100 and 2200. The insulating layer 2207 makes hydrogen remain in the lower portion, thereby improving the reliability of the transistor 2200. In addition, since the insulating layer 2207 suppresses diffusion of hydrogen from the lower portion to the upper portion, the reliability of the transistor 2100 also can be improved.

The insulating layer 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating layer 2208 having a function of preventing diffusion of hydrogen is preferably formed over the transistor 2100 to cover the transistor 2100 including an oxide semiconductor layer. For the insulating layer 2208, a material that is similar to that of the insulating layer 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating layer 2208 covering the transistor 2100, release of oxygen from the oxide semiconductor layer included in the transistor 2100 can be prevented and entry of water and hydrogen into the oxide semiconductor layer can be prevented.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Inverter]

A circuit diagram in FIG. 10B shows a configuration of a so-called CMOS inverter circuit in which the p-channel transistor 2200 and the n-channel transistor 2100 are connected to each other in series and in which gates of them are connected to each other.

[CMOS Analog Switch]

A circuit diagram in FIG. 10C shows a configuration in which sources of the transistors 2100 and 2200 are connected to each other and drains of the transistors 2100 and 2200 are connected to each other. With such a configuration, the transistors can function as a so-called CMOS analog switch.

[Memory Device Example]

Figure 11A:
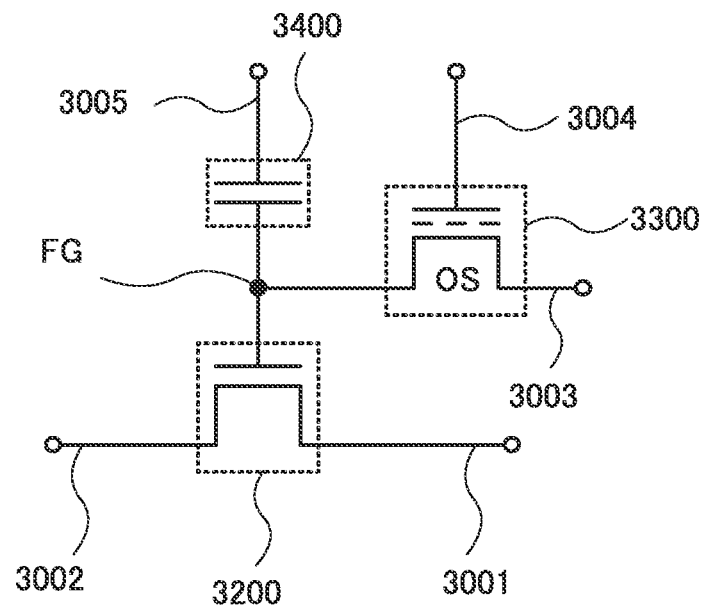
FIGS. 11A and 11B illustrate structure examples of memory devices of embodiments.
Figure 11B:
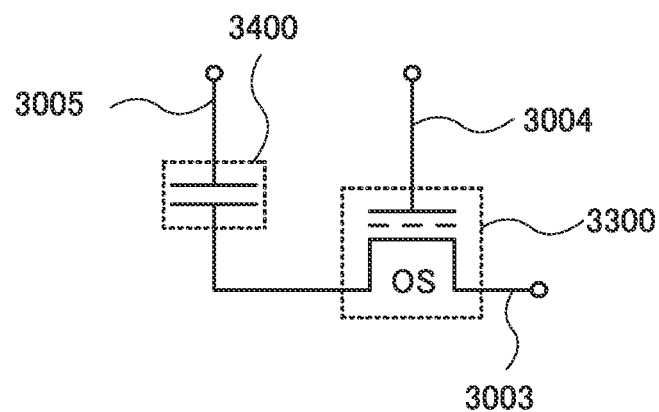

An example of a semiconductor device (memory device) which includes the transistor of one embodiment of the present invention, which can retain stored data even when not powered, and which has an unlimited number of write cycles is shown in FIGS. 11A and 11B.

The semiconductor device illustrated in FIG. 11A includes a transistor 3200 using a first semiconductor material, a transistor 3300 using a second semiconductor material, and a capacitor 3400. Note that any of the above-described transistors can be used as the transistor 3300.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 11A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 11A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 11B is different from the semiconductor device illustrated in FIG. 11A in that the transistor 3200 is not provided. Also in this case, writing and retaining operation of data can be performed in a manner similar to the semiconductor device illustrated in FIG. 11A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The structures, methods, and the like described in this embodiment can be combined as appropriate with any of the structures, methods, and the like described in the other embodiments.

Embodiment 7

In this embodiment, an RFID tag that includes the transistor described in the above embodiments or the memory device described in the above embodiment is described with reference to FIG. 12.

The RFID tag of this embodiment includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have extremely high reliability in order to be used for this purpose.

A configuration of the RFID tag will be described with reference to FIG. 12. FIG. 12 is a block diagram illustrating a configuration example of an RFID tag.

Figure 12:
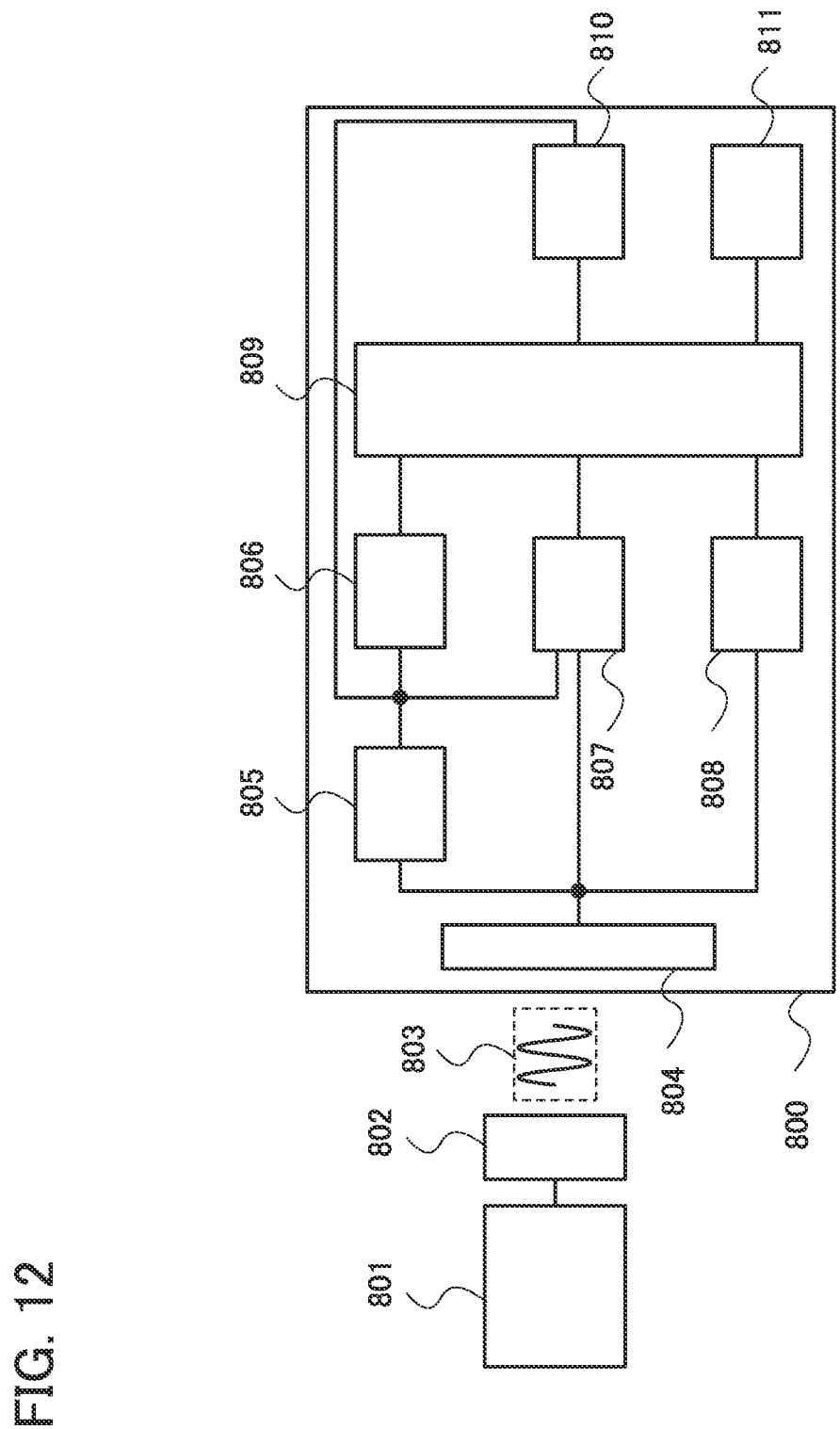
FIG. 12 illustrates a structure example of an RFID tag of one embodiment.

As shown in FIG. 12, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RFID tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 8

In this embodiment, a CPU in which at least the transistor described in any of the above embodiments can be used and the memory device described in the above embodiment is included is described.

Figure 13:
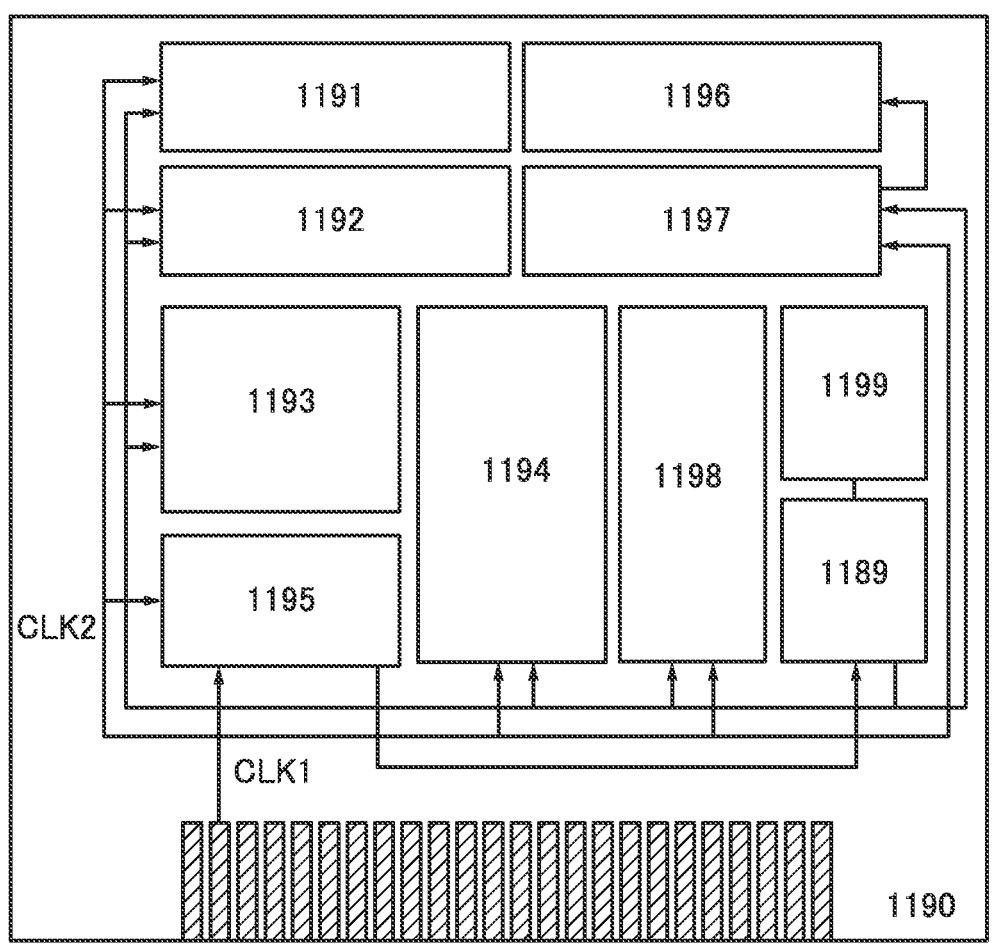
FIG. 13 illustrates a structure example of a CPU of one embodiment.

FIG. 13 is a block diagram illustrating a configuration example of a CPU at least partly including any of the transistors described in the above embodiments as a component.

The CPU illustrated in FIG. 13 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 13 is just an example in which the configuration has been simplified, and an actual CPU may have a variety of configurations depending on the application. For example, the CPU may have the following configuration: a structure including the CPU illustrated in FIG. 13 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 13, a memory cell is provided in the register 1196. For the memory cell of the register 1196, any of the transistors described in the above embodiments can be used.

In the CPU illustrated in FIG. 13, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 14:
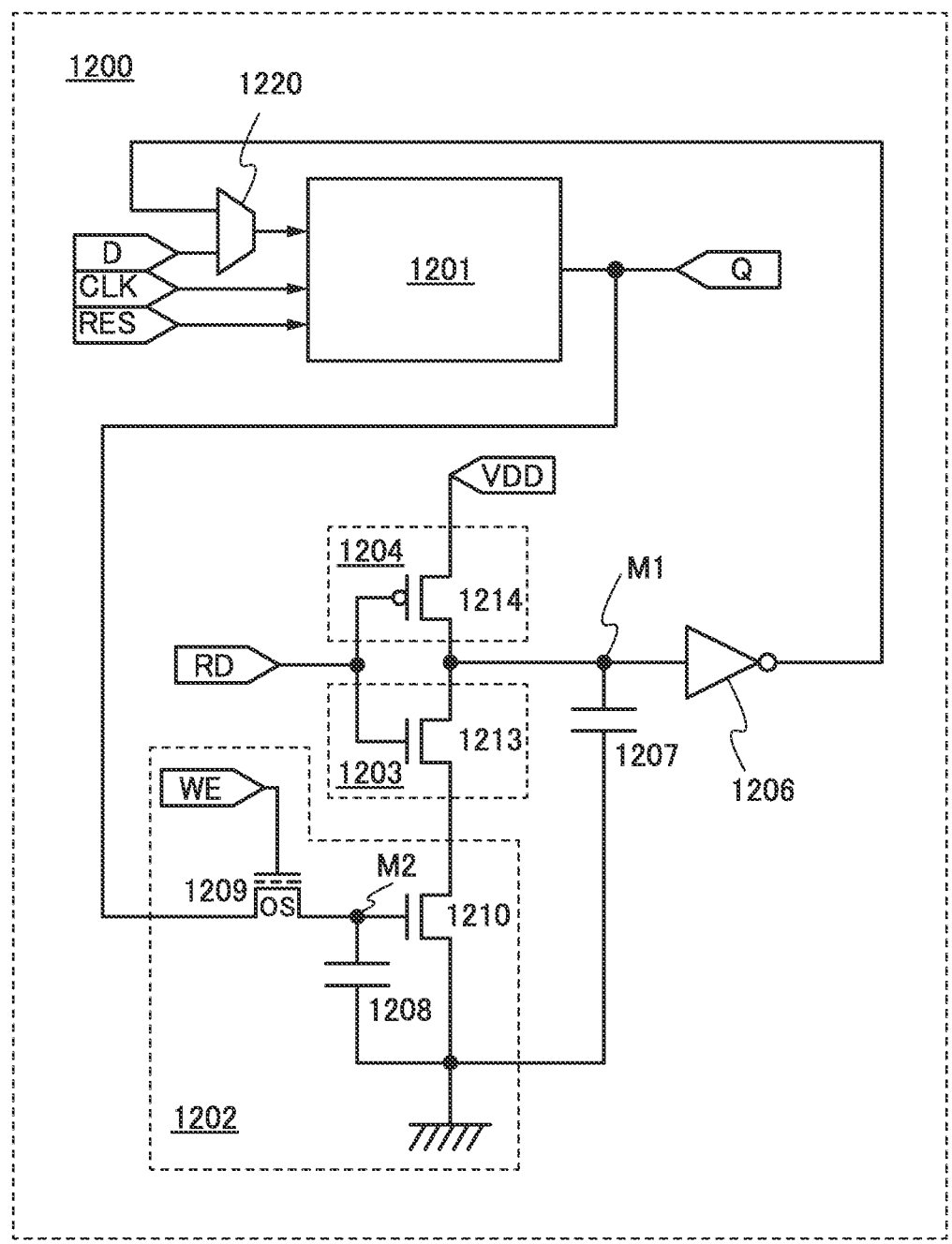
FIG. 14 is a circuit diagram of a memory element of one embodiment.

FIG. 14 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g. GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g. VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 14 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 14, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 14, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 14, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

The structures, methods, and the like described in this embodiment can be combined as appropriate with any of the structures, methods, and the like described in the other embodiments.

Embodiment 9

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15F illustrate specific examples of these electronic devices.

Figure 15A:
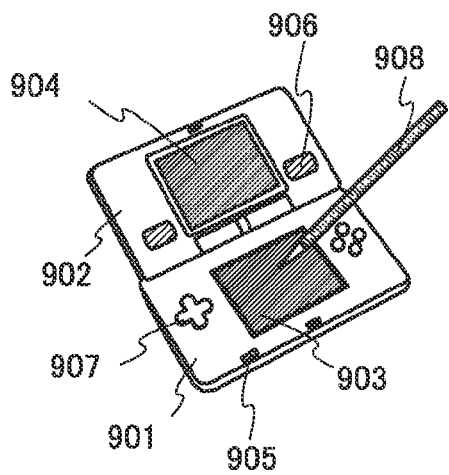
FIGS. 15A to 15F each illustrate an electronic device of one embodiment.

FIG. 15A illustrates a portable game console including a housing 901, a housing 902, a display portion 903, a display portion 904, a microphone 905, a speaker 906, an operation key 907, a stylus 908, and the like. Although the portable game machine in FIG. 15A has the two display portions 903 and 904, the number of display portions included in a portable game machine is not limited to this.

Figure 15B:
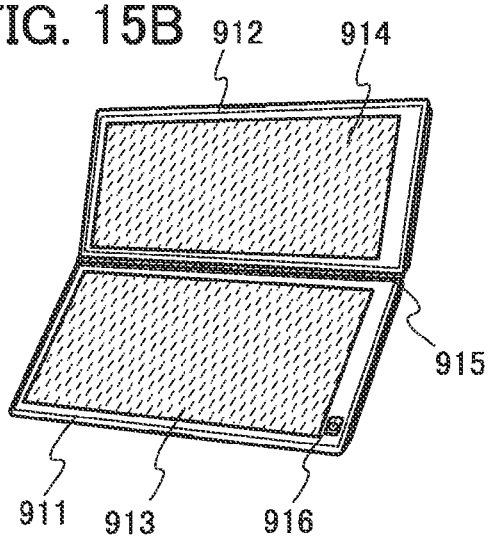

FIG. 15B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 15C:
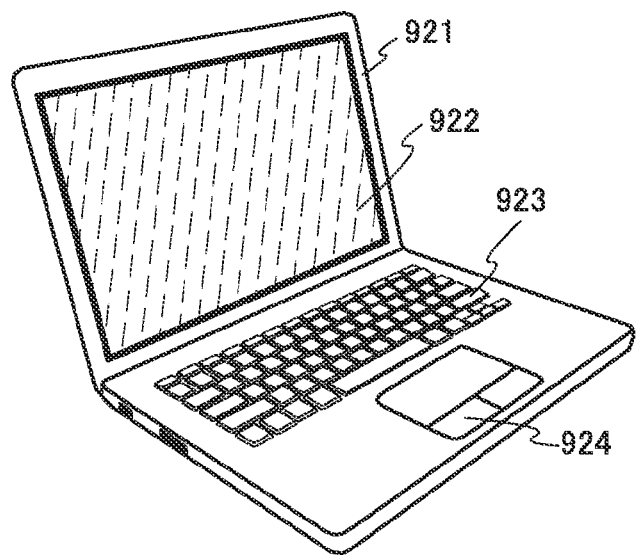

FIG. 15C illustrates a laptop personal computer, which includes a housing 921, a display portion 922, a keyboard 923, a pointing device 924, and the like.

Figure 15D:
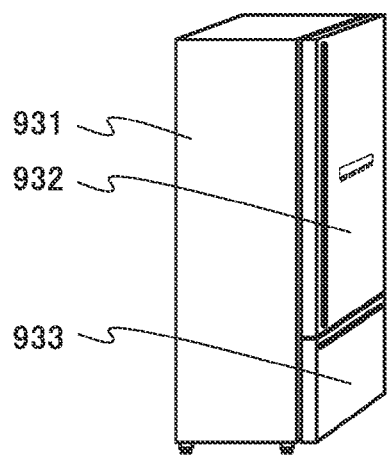

FIG. 15D illustrates an electric refrigerator-freezer including a housing 931, a door for a refrigerator 932, a door for a freezer 933, and the like.

Figure 15E:
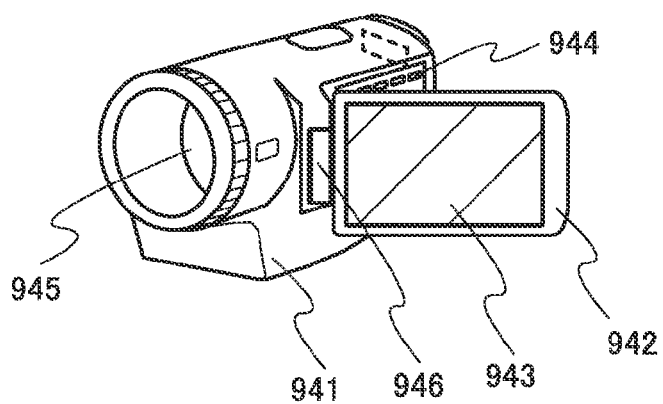

FIG. 15E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 15F:
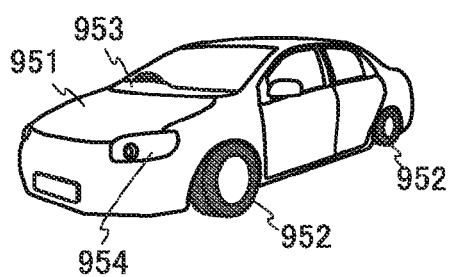
Figure 16A:
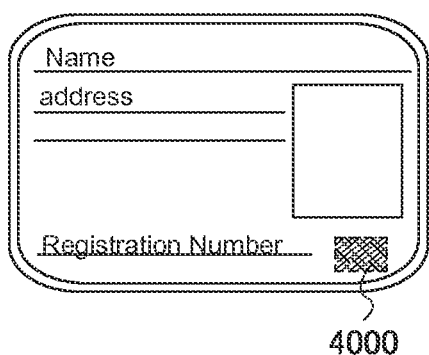
FIGS. 16A to 16F each show an application example of an RFID of one embodiment.
Figure 16B:
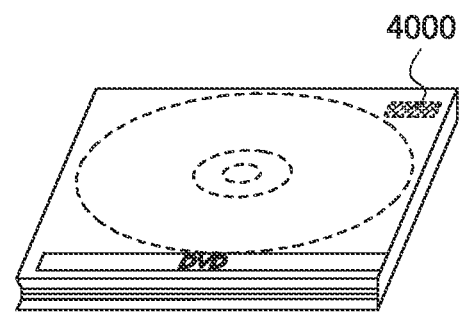
Figure 16C:
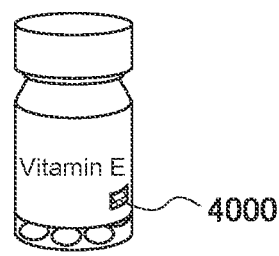
Figure 16D:
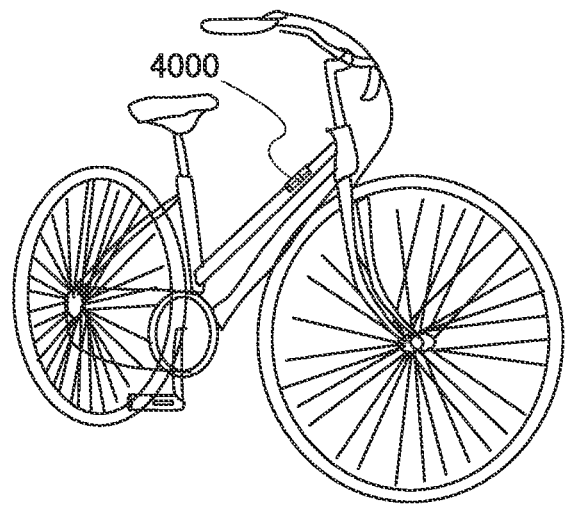
Figure 16E:
Figure 16F:
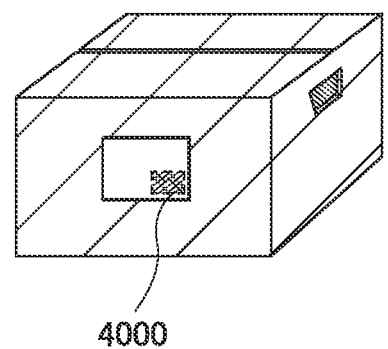

FIG. 15F illustrates an ordinary vehicle including a car body 951, wheels 952, a dashboard 953, lights 954, and the like.

The structures, methods, and the like described in this embodiment can be combined as appropriate with any of the structures, methods, and the like described in the other embodiments.

Embodiment 10

In this embodiment, application examples of an RFID of one embodiment of the present invention will be described with reference to FIGS. 16A to 16F. The RFID is widely used and can be provided for, for example, products such as bills, coins, securities, bearer bonds, documents (e.g., driver's licenses or resident's cards, see FIG. 16A), packaging containers (e.g., wrapping paper or bottles, see FIG. 16C), recording media (e.g., DVD software or video tapes, see FIG. 16B), vehicles (e.g., bicycles, see FIG. 16D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 16E and 16F).

An RFID 4000 of one embodiment of the present invention is fixed to a product by being attached to a surface thereof or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

The structures, methods, and the like described in this embodiment can be combined as appropriate with any of the structures, methods, and the like described in the other embodiments.

This application is based on Japanese Patent Application serial no. 2013-165779 filed with Japan Patent Office on Aug. 9, 2013, the entire contents of which are hereby incorporated by reference.

This application is based on Japanese Patent Application serial no. 2013-165851 filed with Japan Patent Office on Aug. 9, 2013, the entire contents of which are hereby incorporated by reference.

This application is based on Japanese Patent Application serial no. 2013-165852 filed with Japan Patent Office on Aug. 9, 2013, the entire contents of which are hereby incorporated by reference.

What is claimed is:

1. A method for manufacturing a semiconductor device, comprising the steps of:
   forming an insulating layer over a substrate;
   forming an oxide semiconductor layer over the insulating layer;
   forming a first gate insulating layer over the oxide semiconductor layer;
   forming a second gate insulating layer over the first gate insulating layer by a sputtering method or an atomic layer deposition method at a substrate temperature of higher than or equal to 100° C.; and
   forming a gate electrode layer over the second gate insulating layer,
   wherein the second gate insulating layer includes charge trap states trapping negative charges, and
   wherein a density of the charge trap states is lower in the first gate insulating layer than in the second gate insulating layer.

2. The method for manufacturing a semiconductor device according to claim 1, wherein the oxide semiconductor layer comprises In, Ga, and Zn.

3. The method for manufacturing a semiconductor device according to claim 1, wherein the second gate insulating layer comprises an oxide containing one or more elements selected from hafnium, aluminum, tantalum, and zirconium.

4. The method for manufacturing a semiconductor device according to claim 3, wherein the first gate insulating layer comprises the oxide and at least one selected from nitrogen, zirconium, and lanthanoid.

5. A method for manufacturing a semiconductor device, comprising the steps of:
   forming an insulating layer over a substrate;
   forming an oxide semiconductor layer over the insulating layer;
   forming a first gate insulating layer over the oxide semiconductor layer;
   forming a second gate insulating layer over the first gate insulating layer by a sputtering method or an atomic layer deposition method at a substrate temperature of higher than or equal to 100° C.;
   adding nitrogen, zirconium, or lanthanoid to a region in the vicinity of a surface of the second gate insulating layer; and
   forming a gate electrode layer over the second gate insulating layer,
   wherein the second gate insulating layer includes charge trap states trapping negative charges, and
   wherein a density of the charge trap states is lower in the first gate insulating layer than in the second gate insulating layer.

6. The method for manufacturing a semiconductor device according to claim 5, wherein the oxide semiconductor layer comprises In, Ga, and Zn.

7. The method for manufacturing a semiconductor device according to claim 5, wherein the second gate insulating layer comprises an oxide containing one or more elements selected from hafnium, aluminum, tantalum, and zirconium.

8. The method for manufacturing a semiconductor device according to claim 5, wherein the step of adding is performed by an ion implantation method or an ion doping method.

9. A method for manufacturing a semiconductor device, comprising the steps of:
   forming an insulating layer over a substrate;
   forming an oxide semiconductor layer over the insulating layer;
   forming a first gate insulating layer over the oxide semiconductor layer;
   forming a second gate insulating layer over the first gate insulating layer by a sputtering method or an atomic layer deposition method at a substrate temperature of higher than or equal to 100° C.; and forming a metal nitride film having conductivity over the second gate insulating layer by a sputtering method as a gate electrode layer, wherein the second gate insulating layer includes charge trap states trapping negative charges, and wherein a density of the charge trap states is lower in the first gate insulating layer than in the second gate insulating layer.

10. The method for manufacturing a semiconductor device according to claim 9, wherein the oxide semiconductor layer comprises In, Ga, and Zn.

11. The method for manufacturing a semiconductor device according to claim 9, wherein the second gate insulating layer comprises an oxide containing one or more elements selected from hafnium, aluminum, tantalum, and zirconium.

12. The method for manufacturing a semiconductor device according to claim 9, further comprising the step of:

performing heat treatment to diffuse nitrogen included in the metal nitride film to a region in the vicinity of a surface of the second gate insulating layer, after the metal nitride film is formed.

13. The method for manufacturing a semiconductor device according to claim 1, wherein the first gate insulating layer includes an element making the charge trap states disappear.

14. The method for manufacturing a semiconductor device according to claim 5, wherein the first gate insulating layer includes an element making the charge trap states disappear.

15. The method for manufacturing a semiconductor device according to claim 9, wherein the first gate insulating layer includes an element making the charge trap states disappear.

16. The method for manufacturing a semiconductor device according to claim 5, wherein a density of the charge trap states is lower in the region than in the second gate insulating layer.

17. The method for manufacturing a semiconductor device according to claim 12, wherein after the heat treatment, a density of the charge trap states is lower in the region than in the second gate insulating layer.

* * * * *